United States Patent [19]
Smith, Jr. et al.

[11] Patent Number: 5,810,988
[45] Date of Patent: Sep. 22, 1998

[54] APPARATUS AND METHOD FOR GENERATION OF MICROSPHERES OF METALS AND OTHER MATERIALS

[75] Inventors: Charles Vincent Smith, Jr., Cedar Hill; John William Priest, Dallas; Patrick Neil DuBois, Argyle, all of Tex.

[73] Assignee: Board of Regents, University of Texas System, Austin, Tex.

[21] Appl. No.: 722,410

[22] Filed: Oct. 1, 1996

Related U.S. Application Data

[63] Continuation-in-part of Ser. No. 308,811, Sep. 19, 1994, Pat. No. 5,560,543.

[51] Int. Cl.$^6$ ........................................ B05B 1/00
[52] U.S. Cl. .................... 204/666; 239/102.2; 239/135; 239/4
[58] Field of Search ............................... 237/102.2, 135, 237/4; 204/666

[56] References Cited

U.S. PATENT DOCUMENTS

| | | | |
|---|---|---|---|
| 1,932,499 | 10/1933 | Woods | 13/22 |
| 2,269,528 | 1/1942 | Gallup | 83/91 |
| 2,510,574 | 6/1950 | Greenhalgh | 18/47.2 |
| 2,574,357 | 11/1951 | Stammer et al. | 264/13 |
| 2,779,623 | 1/1957 | Eisenkraft | 239/102.2 |
| 2,789,008 | 4/1957 | Cronin | 239/102.2 |
| 3,023,171 | 2/1962 | Smith | 264/14 |
| 3,281,860 | 10/1966 | Adams et al. | 239/102.2 |
| 3,298,030 | 1/1967 | Lewis et al. | |
| 3,683,212 | 8/1972 | Zoltan | |
| 3,700,169 | 10/1972 | Naydan et al. | 239/102.2 |
| 3,739,393 | 6/1973 | Lyon et al. | 239/102.2 |

(List continued on next page.)

FOREIGN PATENT DOCUMENTS 91204   4/1994   Japan.

OTHER PUBLICATIONS

Article Entitled, "Manufacturing Parts, Drop by Drop," *Compressed Air Magazine*, pp. 38–44, Mar. 1995.

Demonstration Flyer Entitled, "Demonstration—IBM MicroDynamic Solder Pump," *IBM Corporation, Austin, Texas*, received at Surface Mount Int'l Proceedings in San Jose, CA, Aug. 30–31, 1994.

Hayes et al., "Picoliter Solder Droplet Dispensing," *MicroFab Technologies, Inc., ISHM '92*, pp. 1–6, Oct. 1992.

(List continued on next page.)

*Primary Examiner*—Arun S. Phasge
*Attorney, Agent, or Firm*—Arnold White & Durkee

[57] ABSTRACT

Apparatus and methods for making uniformly-sized and predictably-spaced droplets or solid microspheres from high-temperature or other liquids. Liquid droplet generators having electromechanical driving elements are coupled to a power supply to apply pulsed excitation forces through a wall of a delivery tube to a liquid, e.g., a liquid metal, epoxy, or polymer. The excitation forces generated by the driver induce capillary vibrations in the liquid within the delivery tube, which breaks the stream into substantially uniformly-sized liquid droplets shortly after leaving the orifice. Droplets may be produced in a uniformly-spaced series, or individually on demand in response to a single burst of force from the driving element. If solid microspheres are desired, the trajectory of the emitted droplets is determined to permit the solidification prior to catching or collecting the microspheres. Solidification of the spherical drops may be accomplished by freezing, evaporation, or chemical reaction due to heat transfer, material transfer, or chemical reaction as the droplets traverse a controlled environment chamber. To permit collection of the microspheres with controlled material properties and without deforming or otherwise changing either the sphericity or surface quality, the flight path environment is controlled to bring the drops to a very low speed prior to collection of the solidified microspheres.

32 Claims, 16 Drawing Sheets

U.S. PATENT DOCUMENTS

| | | | |
|---|---|---|---|
| 3,832,579 | 8/1974 | Arndt . | |
| 3,952,921 | 4/1976 | Tanner . | |
| 3,958,249 | 5/1976 | DeMaine et al. | 239/102.2 |
| 3,972,474 | 8/1976 | Keur . | |
| 4,035,116 | 7/1977 | O'Brien et al. | 425/10 |
| 4,243,995 | 1/1981 | Wright et al. | 310/345 |
| 4,380,518 | 4/1983 | Wydro, Sr. | 264/13 |
| 4,406,405 | 9/1983 | Marichy | 239/10.22 |
| 4,418,354 | 11/1983 | Perduijn . | |
| 4,467,236 | 8/1984 | Kolm et al. | 310/331 |
| 4,511,600 | 4/1985 | Leas . | |
| 4,523,202 | 6/1985 | Gamblin | 239/102.2 |
| 4,527,717 | 7/1985 | Emoto et al. . | |
| 4,619,845 | 10/1986 | Ayers et al. . | |
| 4,689,515 | 8/1987 | Benndorf et al. | 239/102.2 |
| 4,736,704 | 4/1988 | Henninger . | |
| 4,774,037 | 9/1988 | Hendricks | 264/9 |
| 4,795,330 | 1/1989 | Noakes et al. | 425/6 |
| 4,818,279 | 4/1989 | Chaleat et al. | 75/0.5 C |
| 4,828,886 | 5/1989 | Hieber | 427/422 |
| 4,891,242 | 1/1990 | Ito et al. . | |
| 4,925,103 | 5/1990 | Muench et al. . | |
| 4,929,400 | 5/1990 | Rembaum et al. | 264/10 |
| 4,935,173 | 6/1990 | Huey et al. | 264/14 |
| 4,991,287 | 2/1991 | Piatt et al. . | |
| 5,008,582 | 4/1991 | Tanuma et al. | 310/330 |
| 5,103,763 | 4/1992 | Goldowsky et al. | 239/102.2 |
| 5,132,248 | 7/1992 | Drummond et al. . | |
| 5,152,457 | 10/1992 | Burwell et al. | 239/102.2 |
| 5,154,347 | 10/1992 | Vijay | 239/102.2 |
| 5,196,667 | 3/1993 | Gammelin | 239/135 |
| 5,229,016 | 7/1993 | Hayes et al. . | |
| 5,248,087 | 9/1993 | Dressler | 239/102.2 |
| 5,266,098 | 11/1993 | Chun et al. . | |
| 5,401,445 | 3/1995 | Menchhofer | 264/13 |
| 5,560,543 | 10/1996 | Smith et al. | 239/102.2 |

OTHER PUBLICATIONS

Schiesser et al., "Micro Dynamic Solder Pump: Drop on Demand Eutectic Solder Dispensing Device," *Proceedings of Surface Mount Int'l, San Jose, CA,* pp. 501–509, Aug. 1994.

Teng and Vest, "Metallization of Solar Cells with Ink Jet Printing and Silver Metallo–Organic Inks," *IEEE Trans on Components, Hybrids, and Mfg. Technology,* 11:291–297, Sep. 1988.

Teng, "Ink Jet Printing inThick Film Hybrid Microelectronics," *Dissertation Abstracts Int'l,* 48:225–B, Jul. 1987.

Travis, "Making Materials that are Good to the Last Drop," *Science,* 258:1307, Nov. 1992.

Vest et al., "Ink Jet Printing of Hybrid Circuits," *Int. Journal for Hybrid Microelectronics,* 6:261–267, 1983.

Wallace, "Automated Electronic Circuit Manufacturing Using Ink–Jet Technology," *Journal of Electronic Packaging,* 111:108–111, Jun. 1989.

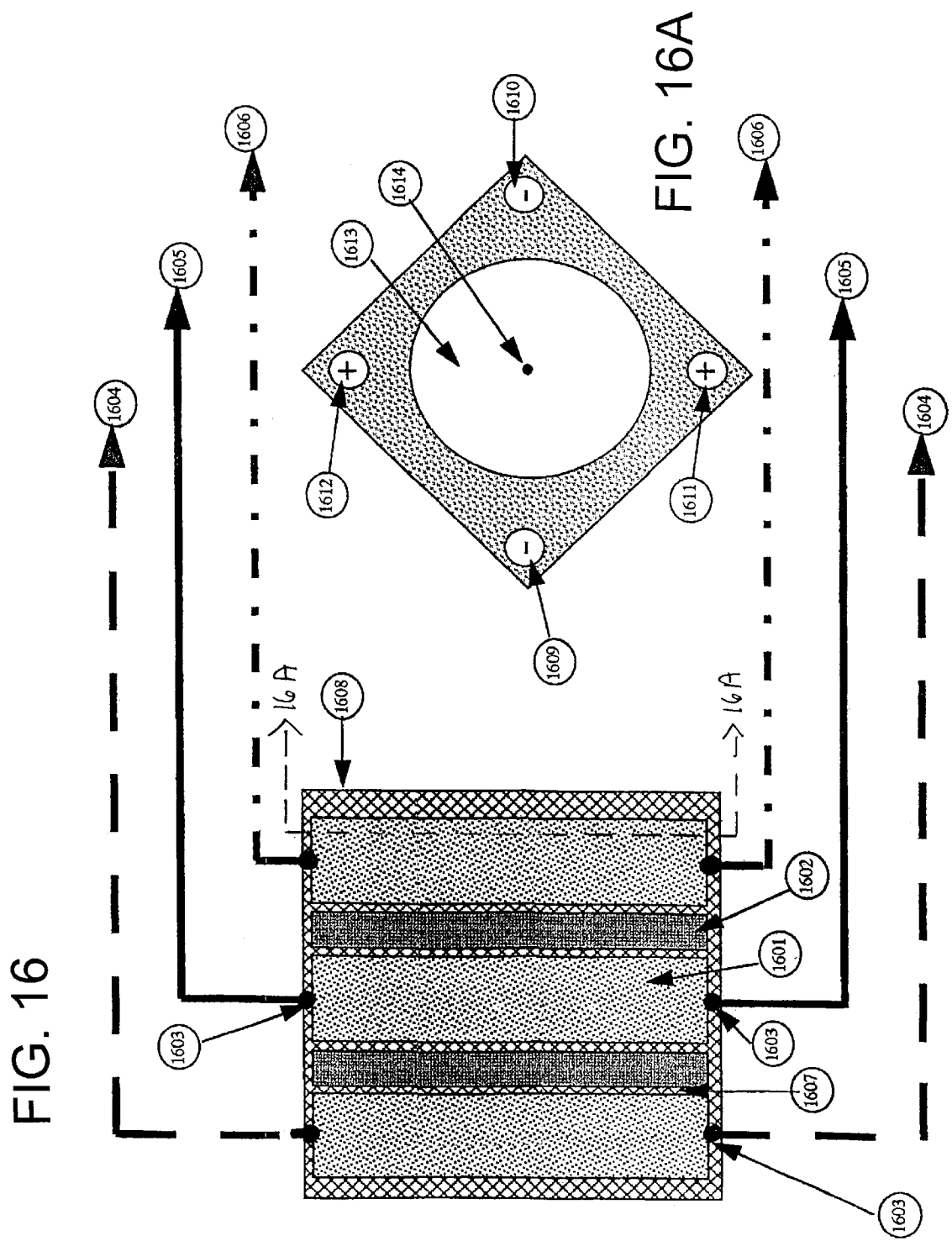

APPARATUS AND METHOD FOR GENERATION OF MICROSPHERES OF METALS AND OTHER MATERIALS

The present application is a continuation-in-part of Ser. No. 08/308,811 filed Sept. 19, 1994 U.S. Pat. No. 5,560,543, issued Oct. 1, 1996. The entire text of the above-referenced disclosure is specifically incorporated by reference herein without disclaimer.

BACKGROUND OF THE INVENTION

The invention relates to methods and apparatus to produce uniformly-sized liquid droplets, particularly for use in deposition techniques using droplets of high-temperature liquids.

Liquid expelled as a jet stream flowing through a small (capillary) orifice under constant pressure tends to break up into droplets of non-uniform size and spacing. If ultrasonic vibrations of suitable frequency are induced in the liquid jet stream, pressure oscillations will propagate through the jet stream. Amplification of capillary waves in the liquid jet stream will cause the size and spacing of droplets formed in the expelled jet stream to become more uniform.

Vibrations may be induced in the liquid jet directly by tuning forks or other mechanical vibrators, or through forces induced by electromagnetic fields or piezoelectric driving elements that are coupled to the fluid jet stream through the walls of a containment vessel. Systems in which movement of the liquid jet stream through the orifice and application of the vibration are substantially uninterrupted are said to operate in a continuous mode.

Droplets may also be generated when a pressure pulse is applied to a static liquid in a vessel with one or more orifices. In such a system, no liquid flow occurs in the absence of a pressure pulse. However, when the liquid is subjected to a brief controlled pressure pulse, the resulting volumetric change in the fluid causes pressure/velocity transients to occur in the fluid. These transients in turn force a droplet of predictable size to issue from an orifice. Because a droplet is produced only when a pressure pulse is applied to the liquid, such a system is said to operate in a drop-on-demand mode.

In certain manufacturing processes, it is desirable to produce metal drops of a known, and perhaps uniform, size and with known or controlled material properties. Liquid metal systems operating in a continuous or drop-on-demand mode for droplet production have been described in United States Patents (e.g., U.S. Pat. No. 5,266,098 to Chun et al.; U.S. Pat. No. 5,229,016 to Hayes et al.; U.S. Pat. No. 3,683,212 to Zoltan; U.S. Pat. No. 4,527,717 to Emoto et al.; and U.S. Pat. No. 4,828,886 to Hieber, the disclosures of all of which are incorporated herein by reference).

Droplet generators having magnetostrictive or piezoelectric driving elements (see Chun et al., Hieber, and Zoltan) are generally limited to low melting-point metals and metal mixtures (70°–200° C.) in liquid metal applications because magnetostrictive or piezoelectric driving elements lose their responsive properties at temperatures greater than the Curie temperature of the material in question (about 350° C. for typical piezoelectric materials such as lead zirconium titanate (PZT)). Thus, droplet generators using piezoelectric or magnetostrictive driving elements have not been successful in systems using high-temperature solders or metals such as copper (melting point 1083° C.).

Because droplet generators suitable for drop-on-demand or continuous service with high-temperature liquids have not been able to use piezoelectric driving elements, mechanical systems of valves or pistons have been favored instead. Mechanical generators can be made relatively heat tolerant; however, their mechanical linkages result in more limited frequency response than that obtainable with magnetostrictive or piezoelectric elements. Known high-temperature droplet generators operate at much lower frequencies and narrower bandwidths than those obtainable in low-temperature systems with piezoelectric driving elements. Thus, a need exists for broad-bandwidth droplet generators for use with high-temperature liquids.

The invention also relates to the production of spherical microballs, or microspheres, and powders of various materials, such as semiconductors, metals, dielectrics, glass, radioactive materials, and mixtures such as solder, as well as ball bearings; the dispensing of precision nonmetal materials such as adhesives; and the manufacture of standard dose elements for pharmaceutical purposes.

Atomization is one method currently used to manufacture powders, solder balls and other metal drops. However, atomization is very inefficient and often does not provide desired uniform ball size or surface quality. A "Sol-Gel" process has been employed and used in conjunction with jetting to generate drops containing nuclear fusion fuel which may be fired prior to assembly into reactor fuel rods. Jetting has also been proposed for the manufacture of laser-induced inertially-confined thermonuclear fuel targets. However, currently practiced ball generation and catching methods typically require large environmentally controlled rooms. In addition, uniformity often is difficult to achieve with these methods, and in most instances a separate sorting process is required to size the balls.

Other methods and apparatus for forming essentially spherical particles include those that rely on drop cooling molten particles through a non-oxidizing environment. In these methods, particles are either dropped or propelled upward and allowed to fall into liquid or onto a target surface for collection. Still other processes utilize a non-oxidizing quenching liquid into which particles are dropped or injected. However, none of these devices or methods produce a spherical solid that is caught and collected in a manner that will not deform its sphericity, mar its surface, or affect its material properties, and none allow the control of the material's properties.

Known methods also typically achieve only relatively limited control of the particles. For example, one method induces a charge before droplet formation, so that all droplets are charged, rather than just a selected group of droplets. Another method induces charges on droplets so that the trajectory of a droplet can be altered to impact a target. In both cases, a separate sorting process is required after the spherical particles are formed and collected. Thus, a need exists for a method and device for forming essentially perfectly uniform and spherical particles, with controlled material properties, that does not require a separate sorting process and which is capable of capturing or collecting the spherical particles in a manner that will not deform particle sphericity or mar particle surfaces.

SUMMARY OF THE INVENTION

The problems outlined above are addressed by the devices and methods of the present invention. Broadly stated, the present invention relates to heat-resistant, broad-bandwidth droplet generators comprising electrically excited electromechanical, magnetostrictive, magnetohydrodynamic and/or piezoelectric driving elements suitable for use in either continuous or drop-on-demand modes with high-temperature liquids (such as molten metals). The present invention also relates to methods and apparatus for solidifying, sorting, and/or capturing droplets while minimizing deformation and controlling material properties.

In one aspect, this invention relates to generation of microspheres of various materials, including semiconductors, metals, dielectrics, and mixtures such as solder with minimal distortion and minimal levels of oxides. Such microspheres may be useful in applications such as electronics manufacturing, where sphericity, volume, material and structure of the microspheres must be held to very tight geometrical and material property tolerances. Specific examples of such applications include, but are not limited to, feedstock for solder and metal pastes, semiconductor thermoelectric elements, semiconductor photovoltaic elements, and ball grid arrays. Nonelectronics applications may include micro-machine elements such as ball bearings, precision nonmetal material dispensing such as adhesives, and the manufacture of standard dose elements for pharmaceutical packages. The apparatus and method of the present invention provide for control of the properties of the microspheres. For example, hardness of the solidified microspheres may be controlled by controlling the cooling rate of the microspheres. Also, the size of the microspheres may be controlled by controlling the jetting parameters of the droplet generator, as discussed below.

The present invention provides a method and apparatus for emitting individual spherical particles (droplets) of high-temperature liquid from an orifice in a delivery tube of small diameter. For purposes of the present invention, "high temperature" is considered to represent temperatures above about 350° C. Of course, the method and apparatus of the present invention will produce droplets in a novel manner even with liquids of much lower temperatures, such as room temperature or less. It is preferred that the high-temperature liquid be maintained at its desired high operating temperature while within its delivery tube. In several preferred embodiments, a driving element applies a force to the delivery tube ("direct coupled") in response to droplet generating instructions. In another preferred embodiment, a driving element acts directly on a liquid jet stream of a conductive material emitted from the delivery tube.

For direct coupled embodiments, both continuous and drop-on-demand systems are provided. In a continuous jet system, a liquid jet stream preferably travels through the delivery tube from a pressurized source. The driving element provides pulsed forces to the delivery tube to induce a perturbation on the liquid jet stream traveling through the tube. Droplets are formed from the jet, which issues from the delivery tube through an exit orifice at a certain velocity. A stream of discrete droplets results, having a frequency corresponding to the frequency of the energy pulses on the delivery tube.

For drop-on-demand jets, the high-temperature liquid is stationary in an optimized (tuned) fluid chamber within the delivery tube. In response to droplet generating instructions, the driving element produces a single force on the delivery tube, large enough to cause a single liquid droplet to be expelled from the exit orifice. It is preferred that the volume of the fluid chamber be such as to optimally convert mechanical force and energy into velocity and kinetic energy of the ejected droplet.

Droplets produced according to the present invention may be captured passively as balls, and travel toward prepositioned targets or are directed thereto by in-flight guidance forces (e.g., by electrostatic or electromagnetic fields altering droplet flight paths). Solidification of the spherical drops into solid microspheres may be accomplished by freezing, evaporation, or chemical reaction due to heat transfer, material transfer, or chemical reaction as the droplets traverse the controlled environment chamber. In one embodiment of the present invention, the trajectory of the droplet stream is preferably parabolic; i.e., the drops are ejected in an upward direction, where they are decelerated by gravity. As the droplets ascend the parabola, they are electrically charged and solidified into solid charged microspheres. When the particles reach the top of the parabola—decelerated by gravity to a minimum speed—they are electrostatically collected. The low speed of the micropheres permits collection of the microspheres with controlled material properties without deforming or otherwise changing either their sphericity or surface quality. A controlled environment chamber may be used to effect the desired solidification and may include nitrogen gas. A catcher system may be used to collect the solid microspheres, and may include apparatus for electrically charging the microspheres and catching them electrostatically.

Where high-temperature liquids are used, a heat source is preferably coupled to the liquid chamber or delivery tube to maintain the liquid in its heated state. A heat source for the tube may be one or more heaters coupled thereto or liquid within the tube or vessel which is heated by other means, such as by an inductive heater or resistively through other means. In addition, the droplet generator itself may be placed in a high-temperature environment, such as in a heated chamber.

Application of high-temperature liquid droplets remotely in the form of droplets has the advantage that physical contact with the surfaces to be wetted does not occur. This is of importance especially for heat sensitive areas and very small areas, as on a typical circuit board. Thus, it is desirable that the droplets be accurately positioned. By a suitable choice of the number of drops to be applied, it is possible to apply an accurately defined quantity of liquid (such as molten metal) to a surface. Thus, it is also desirable to produce liquid drops of a highly consistent volume, shape, and spacing.

The present invention contemplates several embodiments of continuous-mode driving elements that induce vibrations in a fluid jet stream in a delivery tube. The vibrations cause the jet stream to break up into uniformly-sized and uniformly-spaced droplets upon exiting an orifice coupled to the delivery tube.

The present invention also contemplates several embodiments of drivers for drop-on-demand droplet generators. These drivers receive a single burst of a suitable signal (e.g. current or voltage) and translate that burst into a force or pressure pulse that acts upon a tuned fluid chamber to expel a certain quantity of liquid from an orifice coupled to the fluid chamber. In such embodiments, the tuned fluid chamber is preferably bounded at one end by the exit orifice, and at its other end by a flow-restricting orifice. The flow-restricting orifice serves to prevent an excessive quantity of liquid from flowing backwards away from the exit orifice. The flow-restricting orifice may comprise, for example, a nozzle having an opening much smaller than the internal diameter of the fluid chamber, a one-way valve, or other suitable mechanism.

In yet another embodiment, a driver is provided that does not act upon the fluid delivery chamber, but instead provides a magnetic field that acts directly upon the ejected liquid jet stream, wherein the liquid is a conductive material. The magnetic field has regularly-spaced points of maximum field intensity that induce the jet stream to break into droplets of a spacing that corresponds to the spacing between the maximum field-intensity points.

Driving Elements

According to one aspect of the present invention, electromechanical driving elements in droplet generators of the present invention induce vibrations in the fluid jet stream by employing forces on a delivery tube in one of several manners: (1) between electric currents maintained or induced on suitable mechanical structures; (2) between currents and suitable magnetic materials, which form part of the mechanical structure; and (3) based on magnetostriction or piezoelectric effects acting on the wall of the delivery tube (compressing the tube).

According to another aspect of the present invention, magnetohydrodynamic effects may also be employed on an electrically conductive liquid (metal) after it exits the delivery tube. Magnetohydrodynamic effects require the application of magnetic fields to directly act upon the conductive liquid. The variations in the magnetic field will cause a perturbation on the liquid jet stream, causing the jet stream to break up into droplets of a spacing that corresponds to the spacing between points of maximum field intensity.

A liquid droplet generator according to one broad aspect of the present invention thus comprises a delivery tube having a wall and an exit orifice, an electromechanical, magnetostrictive, or piezoelectric driver element coupled to the wall for vibrating said tube, a power supply coupled to the driver, and, for heated liquids, a heat source for heating said delivery tube. The heat source may be coupled to the delivery tube and substantially surround the delivery tube. A temperature controller may also be provided to control the heat source. Alternatively, the heat source may comprise a heated chamber adapted to receive the droplet generator. The internal diameter of the exit orifice is preferably smaller than the internal diameter of the delivery tube.

According to a preferred method of generating liquid droplets according to the present invention, the power supply provides pulsed power to the driver at a frequency corresponding to a desired spacing between droplets generated by the droplet generator. A liquid is delivered to a liquid droplet generator having an electromechanical driver element coupled to the delivery tube. The driver element is electrically excited by the power supply to act upon the wall of the delivery tube, resulting in a series of pressure pulses that cause liquid droplets to form from the jet issuing from the orifice. Alternatively, according to another preferred embodiment, the power supply provides a single pulse of power on demand, forcing a single droplet to issue from the delivery tube in response to that pulse. To prevent an excessive quantity of liquid traveling away from the exit orifice in response to the pulse, the drop-on-demand droplet generator preferably also comprises a flow-restricting orifice disposed within the delivery tube defining a tuned fluid chamber in the tube bounded by the flow-restricting orifice at a first end and by the exit orifice at a second end.

According to one preferred embodiment of the present invention, the electromechanical driver element comprises current windings circumferentially surrounding the tube and acoustically coupled thereto. The current windings are also coupled to the power supply. Electrical insulation is disposed between adjacent current windings. The windings are disposed so that a current traveling through a first winding will be of opposite polarity to a current traveling through an adjacent winding. A force retaining ring is also provided that substantially surrounds the current windings and translates the opposing current forces to pressure pulses that act on the delivery tube.

According to a preferred method of the present invention, a pulsed current is supplied to the current windings, which generates opposing current forces surrounding the delivery tube, thus acting upon the wall of the delivery tube in response to the opposing current forces. In response to the forces, a perturbation is induced in the liquid in the delivery tube. The physics of the jet amplify the perturbations, causing the jet to break into droplets after exiting the delivery tube through the orifice.

According to yet another preferred embodiment of the present invention, the electromechanical driver element comprises an electromagnetic field generator substantially surrounding the delivery tube, and an armature circumferentially coupled to the delivery tube. The electromagnetic field generator comprises an electromagnetic coil having current windings coupled to the power supply. The armature preferably comprises soft magnetic material, such as steel. According to one aspect of the present invention, the armature comprises symmetrically spaced tabs. According to an alternative aspect of the present invention, the armature comprises a notched ring, with the notches being symmetrically spaced. Other suitable configurations of the armature will be apparent to those of skill in the art.

In a preferred method according to the present invention, pulsed current is supplied to the current windings of an electromagnetic coil, generating a pulsed magnetic field substantially and symmetrically surrounding the delivery tube in response to the pulsed current. A portion of the wall of the delivery tube is alternately expanded and contracted radially in response to the pulsed magnetic field forces, acting upon the liquid in the delivery tube in response to the expansion and contraction, and inducing a perturbation on the liquid in the delivery tube in response to the forces. Amplifying the waveform causes the liquid to break into droplets upon exiting the orifice.

A dimension-changing means such as a magnetostrictive element may be part of the driving element, whereby the magnetostrictive element is acoustically coupled to the wall and thermally insulated from the wall. The magnetostrictive element is excited by a magnetic field through application of pulsed current. The magnetostrictive element changes dimension (alternately expands and contracts) in response to the pulsed field, thus acting upon the liquid in the delivery tube in response to the expansion and contraction forces. These forces in turn will induce a perturbation on the liquid in the delivery tube in response to the vibrations. The physics of the jet amplify the perturbations, causing the jet to break into droplets after exiting the delivery tube through the orifice.

For applications involving high-temperature liquids, it is preferred that the magnetostrictive element be insulated from the delivery tube and cooled. Thus, according to yet another preferred embodiment of the present invention, the electromechanical driver element comprises an insulator coupled to the delivery tube and circumferentially surrounding the tube over a portion of the length of the tube. The insulator preferably comprises an acoustically conductive, thermally insulating material. The driver also comprises a first conductor substantially surrounding the insulator and coupled thereto and also coupled to the power supply. A magnetostrictive element is coupled to said first conductor, and a force retaining ring of electrically conductive material substantially surrounds the magnetostrictive element and is coupled thereto and is also coupled to the power supply.

To prevent the magnetostrictive element from becoming overheated in response to high-temperature liquids moving through the delivery tube, cooling means are disposed to draw heat away from said first conductor and said force retaining ring. The cooling means may comprise a thermal electric tap ring coupled to the first conductor and the force retaining ring, and a heat conduit coupled to the tap ring. Heat may be extracted longitudinally from the thermal electric tap ring to one or more suitable heat sinks via the heat conduit. Suitable conductors include copper, silver, platinum, and various alloys. Heat sinks may be accomplished by traditional methods known to those of skill in the art, including convective fluids, heat pipes, evaporative heat transfer, and thermal electric refrigeration.

According to another aspect of the present invention, a dimension-changing means such as a piezoelectric crystal is used to generate the droplet-generating vibrations. A power supply provides pulsed voltage to conductors surrounding the piezoelectric crystal. This voltage pulse is transmitted through the conductors to the piezoelectric crystal, which changes its dimensions (e.g., contracts or expands) in response. This force is coupled through an acoustical conductor to the fluid delivery tube. This in turn results in a perturbation on the fluid jet stream in the delivery tube, causing the jet stream to break into uniformly-sized and uniformly-spaced droplets shortly after exiting the orifice.

A piezoelectric driver may also be used in a drop-on-demand droplet generator, whereby a single voltage pulse causes a single force or pressure pulse to be transmitted from the piezoelectric crystal to a tuned fluid chamber. A certain quantity of liquid will thus be expelled from the fluid chamber.

It is preferred that the piezoelectric crystal be cooled in a manner as described above for a magnetostrictive element.

According to yet another preferred embodiment of the present invention, the liquid droplet generator comprises a delivery tube having a wall and an exit orifice, wherein the delivery tube is adapted to transmit a pressurized liquid jet stream of conductive material through the exit orifice. An electromagnetic driver element is disposed to receive the liquid jet stream from the exit orifice. The driver element in turn comprises a magnetic field yoke having arms corresponding to points of maximum magnetic field intensity, and current windings disposed about a portion of the magnetic field yoke. A power supply is coupled to the current windings of the driver element. To maintain the contents of the delivery tube in a heated state, a heat source is also provided for heating the delivery tube in the manner described above.

In yet another preferred method according to the present invention, droplets of a conductive liquid are generated by delivering liquid under pressure to a liquid droplet generator, wherein the driver acts directly on the liquid expelled from the delivery tube. Current is supplied to the driver element, which generates a magnetic field having spaced points of maximum field intensity. The liquid jet stream is propelled from the delivery tube and through this magnetic field. The magnetic field acts upon the emitted jet stream of conductive liquid, generating a disturbance in the jet stream that causes the jet stream to break up into a series of droplets in response to the magnetic field, the droplets having a spacing corresponding to the spacing of the points of maximum field intensity.

In short, the present invention provides novel apparatus and methods for making uniformly-sized and predictably-spaced droplets from high-temperature liquids. In several preferred embodiments, the liquid droplet generators have electromechanical driving elements coupled to a power supply to apply excitation forces through a wall of a delivery tube to a high-temperature liquid, e.g., a liquid metal. The excitation forces (pressure pulses) generated by the driver induce capillary vibrations in the liquid issuing from the orifice. In response to those capillary vibrations, the liquid jet stream breaks up into substantially uniformly-sized liquid droplets shortly after leaving an orifice in the delivery tube. Droplets may be produced in a uniformly-spaced series, or in single droplets on demand in response to a single burst of pressure from the driving element. Alternatively, droplets may be generated from a jet stream of a conductive material by applying directly to the stream a periodic magnetic field having spaced points of maximum intensity.

Droplet Generating System

In a liquid-droplet generation system according to the present invention, a liquid (which may be of high temperature, such as liquid metal, solder, various polymers, epoxies, etc.) is supplied from a supply tank through a pump, which in turn pumps the liquid to a delivery tube. According to a preferred embodiment of the present invention, the delivery pump is gas-pressured. Suitable delivery tube materials include aluminum, stainless steel, molybdenum, graphite, tantalum, and ceramic. Stainless steel and molybdenum are preferred delivery-tube wall materials according to the present invention. To keep the liquid in a heated or melted state, a heater, if desired, may be coupled to the delivery tube. A temperature controller may be provided to regulate the temperature of the heater.

A driver acts to create droplets from the liquid, either continuously or on demand, in one of several manners described above. A power supply provides necessary power to the driver, either in pulses at a frequency selected according to the spacing desired between droplets or in single bursts on demand. For precise placement on a target (such as a circuit board), the droplets may be selectively charged by a charge electrode in response to, for example, a CAD/CAM input. Selectively charged droplets are then passed through a voltage field, which causes selective deflection of the droplets to a desired position on a target.

Sequential and Simultaneous Force Applications

Electromechanical driving elements of the present invention have characteristic frequency responses and force capabilities. Two or more driving elements of the same or different type may be arranged to be activated sequentially or simultaneously to produce desired force profiles in contained liquids.

In addition, feedback control may be employed in preferred embodiments to alter the timing and force profiles of an individual driving element, or of all driving elements acting on a liquid sequentially or simultaneously.

Spherical Microball Formation and Capture

In one embodiment, the apparatus of the present invention includes a supply for material to be jetted, a droplet generator, and an orifice to create a liquid jet stream from which droplets are formed. A sealed environmental chamber is used to effect desired solidification and material properties, and a microsphere transport system is used to collect solidified drops of material. A jet control system is used for imparting an electrical charge on droplets emitted from the liquid droplet generator. The jet control system comprises a positive electrode plate, a negative electrode plate disposed parallel to the positive electrode plate to form a gap for receiving liquid droplets from the liquid droplet generator. A DC voltage source is coupled to the positive and negative electrode plates. The charged liquid droplets are solidified in flight into solid charged microspheres. The microsphere transport system comprises a stacked array comprising a plurality of electric field electrode plates disposed in an alternating arrangement between electric insulation spacers, and a plurality of positive and a plurality of negative electrodes disposed within each field electrode plate in the stacked array. A power source is electrically coupled to the positive electrodes to provide power to each field electrode plate in sequence along the length of the array, creating a "traveling wave" electric field that pulls charged microspheres along the length of the array toward a collector. Each field electrode plate has a centrally-located hole to form a tunnel internal to said stacked array for admitting charged microspheres.

In this embodiment, a material may be liquefied (e.g., melted and maintained at an elevated temperature) or may be created in a suitable liquid vehicle. A liquid jet is formed from the material to move a desired volume of material through a delivery chamber. The liquid is released from the delivery chamber through an orifice into the controlled environment (flight path) chamber, where the liquid jet stream is broken up into a series of drops. The surface tension of the liquid material or vehicle acts to create spherical drops prior to solidification.

Solidification of the spherical drops into solid microspheres may be accomplished by, among other things, freezing, evaporation, or chemical reaction due to heat transfer, material transfer, or chemical reaction as the droplets traverse the controlled environment chamber. The initial jetting parameters (e.g., volume, jet speed, and orifice diameters) may be chosen such that drops of the desired volume are created. The trajectory is determined to permit solidification prior to catching or collecting the microspheres. The flight path environment is preferably controlled to bring the drops to a very low speed to permit catching or collection of the microspheres without deforming or otherwise changing either the sphericity, surface quality, or material properties. A suitable flight path is a nearly vertical parabolic arc, where the microspheres are collected at or about the top of the arc where the velocity is zero or nearly zero.

In one exemplary method, the droplets are formed on the liquid jet stream emitted from the delivery chamber and are decelerated in a cooling chamber with an inert (i.e., oxygen-free) environment. The droplets may also be given a flight path over a relatively long distance and/or directed upwards into an inert environment. In either of these configurations, gravity and distance are used to decelerate the droplets (microspheres), which are caught on a conveyor belt, also in an inert environment. The inert flight environment may be chilled by dispersing a very cold liquid, such as liquid nitrogen, into the flight environment. Chilling will help to effect solidification of the droplets into solid microspheres.

In another method, the microspheres are deployed into a soft solid, or into a liquid environment, such as liquid nitrogen, which solidifies, decelerates, and catches the microspheres.

An attractive charge may be induced on unwanted microspheres, which may then be deflected from the target to a heated tube with a vacuum, where the microspheres are reflowed and collected in a container for subsequent re-use. In another embodiment, an opposing charge may be induced on the unwanted microspheres, and the desired microspheres may be directed to a chill chamber, where they are solidified and then directed through a vacuum tube to a collection chamber.

In all cases, it is preferable that microspheres be taken to a collection point for later processing and use.

The term "microsphere" refers to generally spherical balls or droplets, either liquid or solid, whose size may range from very small (in the nature of a powder) to much larger, distinct balls.

The advantage of liquid metal jetting according to embodiments of the present invention is uniformity between and among the produced microspheres (e.g., a few percent variation in volume and material property) and the resulting quality of the individual ball surface. In addition, the disclosed method and apparatus does not require a separate sorting process and is capable of capturing the high speed balls generated in the liquid metal jetting process.

The advantages of the present invention will be further appreciated from the drawings and from the detailed description provided below.

BRIEF DESCRIPTION OF THE DRAWINGS

The herein described advantages and features of the present invention, as well as others which will become apparent, are attained and can be understood in more detail by reference to the following description and appended drawings, which form a part of this specification.

It is to be noted, however, that the appended drawings illustrate only exemplary embodiments of the invention and are therefore not to be considered limiting of its scope, for the invention may admit to other equally effective embodiments.

FIG. 3A is a cross-section along plane 3A—3A of FIG. 3.

FIG. 4A is a cross-section along plane 4A—4A of FIG. 4.

FIG. 5A is a cross-sectional view of an armature having symmetrically spaced tabs.

FIG. 5B is a cross-sectional view of an armature having symmetrically spaced notches.

FIG. 16 is a schematic representation of one embodiment of an apparatus for a stacked array according to the present invention used to create an electronically stabilized portion of an electrostatic "traveling wave" electric field.

FIG. 16A is a cross-sectional view along section 16A—16A of FIG. 16.

DESCRIPTION OF ILLUSTRATIVE EMBODIMENTS

Figure 1:
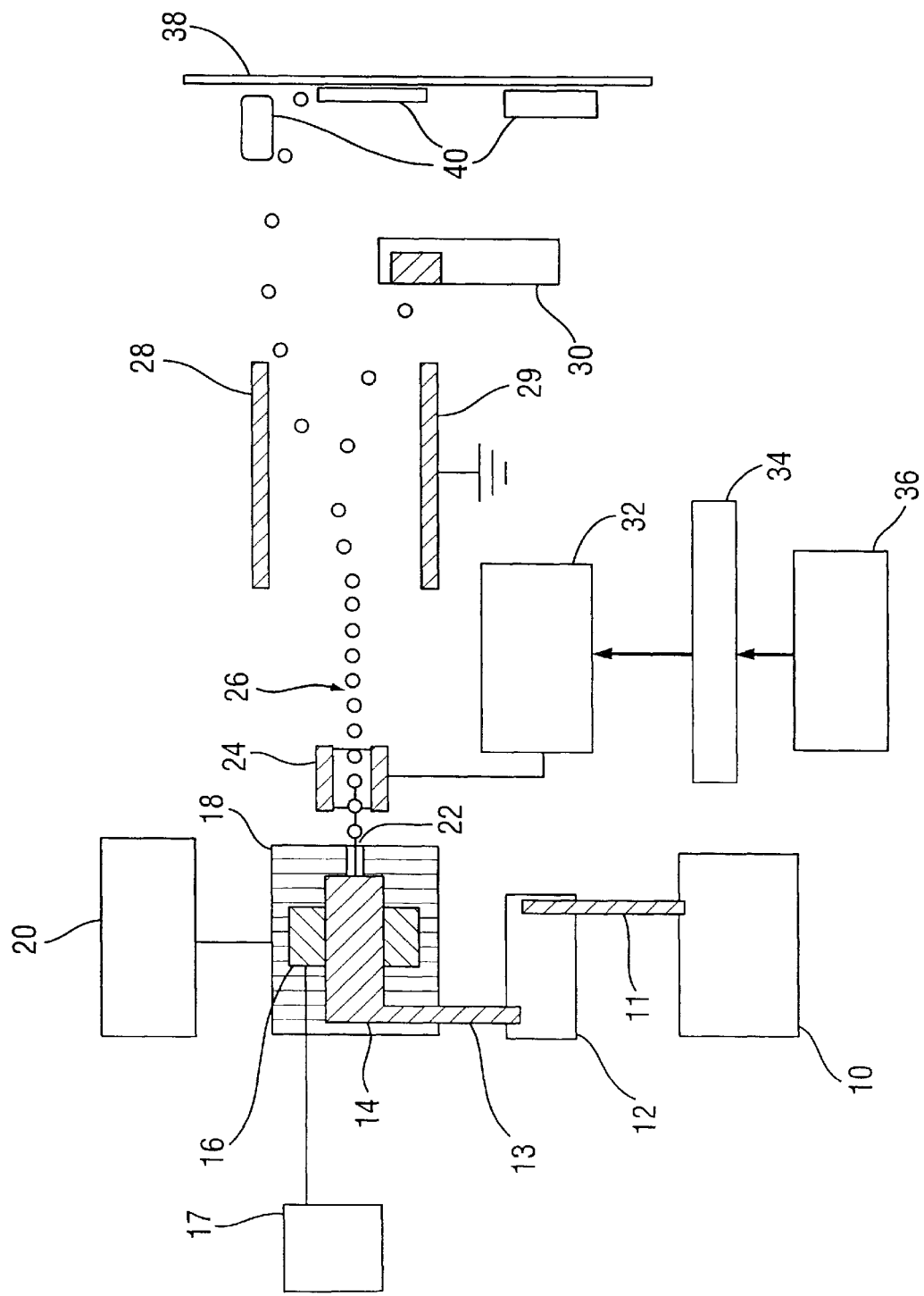
FIG. 1 is a schematic representation of a continuous-type droplet generation system according to the present invention.

Turning now to the figures, FIG. 1 is a schematic representation of a continuous droplet generation system according to the present invention. A liquid (such as liquid metal, solder, epoxy, etc.) is supplied from supply 10 liquid through conduit pump 12, which in turn pumps the liquid through conduit 13 to delivery tube 14. Pump 12 may be gas-pressured to deliver the liquid to delivery tube 14 and through the tube to orifice 22. A suitable gas to be used with a gas-pressured pump is clean, dry nitrogen under a pressure of about 100 psi. Argon is another exemplary gas. Suitable delivery tube materials include aluminum, stainless steel, molybdenum, tantalum, graphite, and ceramics. Stainless steel and molybdenum are preferred delivery tube materials according to the present invention based on their cost, compatibility with high temperatures, and machinability.

For use with high-temperature liquids, it is preferred that the system include heater 18 thermally coupled to delivery tube 14 to keep the liquid in a heated state (or melted state, for metals and solders). Temperature controller 20 may be used to regulate the temperature of heater 18, which is shown in FIG. 1 as substantially surrounding delivery tube 14. Other arrangements for heater 18 will be apparent to those of skill in the art, such as infrared heaters, induction heaters, ovens, etc. In some embodiments, as depicted in subsequent figures, it is preferred that driving element 16 be isolated from heater 18.

Driver 16 acts upon delivery tube 14 to excite the liquid jet stream traveling through delivery tube 14 and induce a waveform thereon, thus causing the liquid jet stream, upon exiting delivery tube through orifice 22, to break into a series of liquid droplets 26. Power supply 17 supplies necessary power to driver 16 in pulses at a frequency selected according to the spacing desired between droplets 26.

The exact size of the droplets is a function of the liquid jet diameter (d), the liquid jet velocity (V), and the frequency of the imposed vibrations (f). The diameter D of the droplets is determined primarily from the diameter of the exit orifice (d), but also is a function of the jet velocity.

$$D = \sqrt[3]{\frac{3d^2 V}{2f}} \qquad 1$$

For precise placement on a target (such as circuit board 38), droplets 26 may be selectively charged by charge electrode 24. CAD/CAM input 36 provides, for example, character data 34 that is fed to charge driver 32. Charge driver 32, in turn, is coupled to charge electrode 24 to selectively charge drops from droplet stream 26. The charged droplet stream is then passed between high voltage plate 28 and grounded plate 29. The voltage field causes selective deflection of the droplets. Uncharged droplets are caught by catcher 30, whereas charged droplets are deposited in appropriate locations on circuit board 38. Alternatively, where static charge build-up can damage sensitive devices, charged droplets may be caught by catcher 30, with the uncharged droplets allowed to proceed to the target. Droplets 26 may be used, for example, to attach circuit components 40 to circuit board 38.

Figure 2:
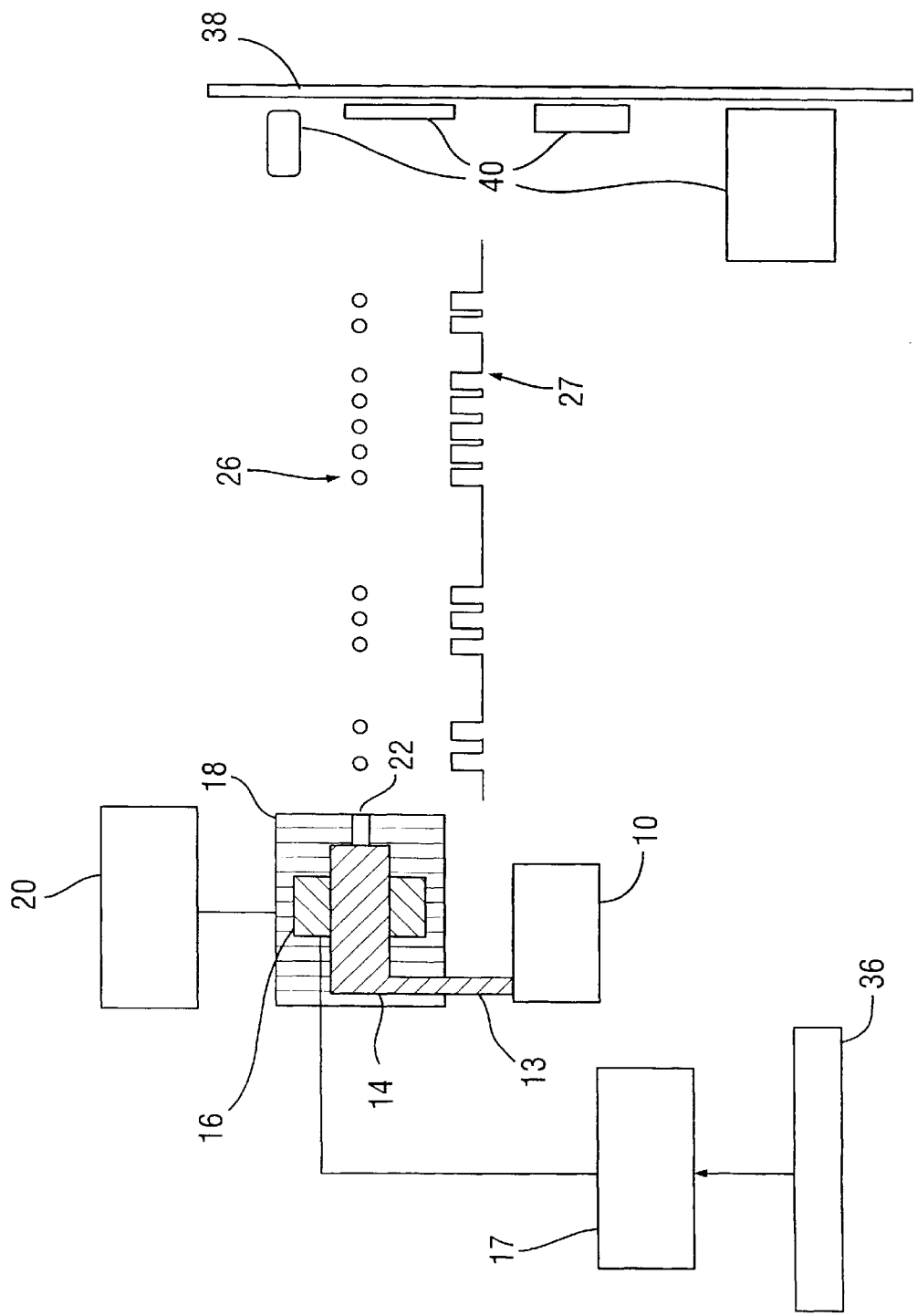
FIG. 2 is a schematic representation of a drop-on-demand droplet generation system according to the present invention.

The droplet generating system of the present invention may also function in a drop-on-demand mode, as illustrated in FIG. 2. A liquid is supplied from supply tank 10, which is preferably gas-pressured. The liquid remains stationary in delivery tube 14 in the absence of an external force. Power supply 17 may be pulsed in response to, for example, CAD/CAM data 36. In response to each pulse, driver 16 provides a force that acts upon the liquid in delivery tube 14 to deliver a single droplet of liquid through orifice 22. CAD/CAM data is shown in FIG. 2 as generating data pulse train 27. Droplets 26 correspond to that data pulse train. These droplets are then applied to a target, such as circuit board 38, where they may be used, for example, to solder circuit components 40 to circuit board 38. The target itself may be selectively moved so that each droplet will land on the appropriate area.

Several preferred embodiments of drivers 16 for droplet generators according to the present invention are discussed below.

Current-to-Current Excitation

Continuous Mode

Figure 3:
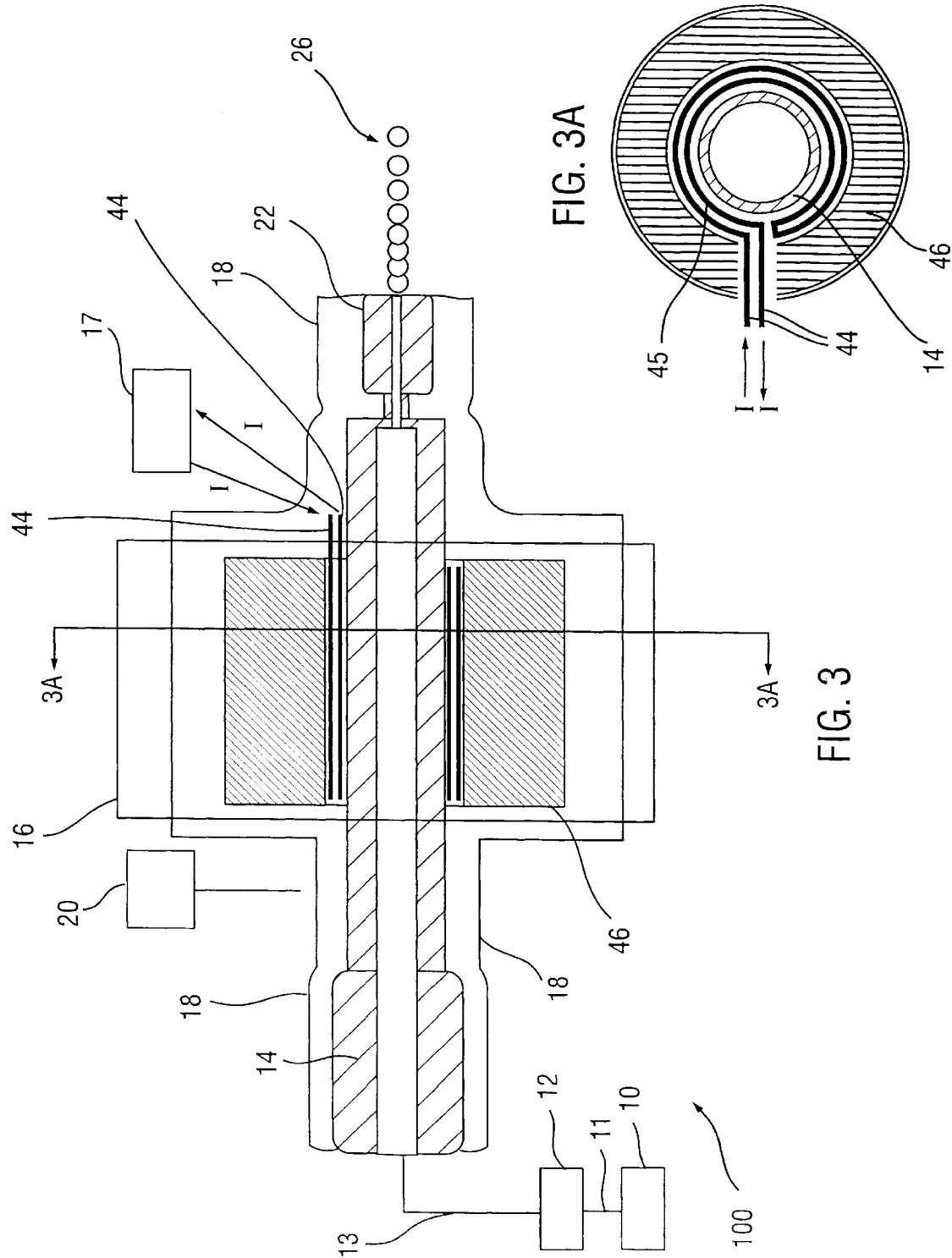
FIG. 3 is a schematic representation of a continuous, electromechanical droplet generator using current-to-current excitation means according to the present invention.

Droplet generator 100 of FIG. 3 comprises delivery tube 14 with heat source 18 preferably positioned and operated to maintain the contents of tube 14 in a heated (liquid) state. Heater 18 is shown in FIG. 3 as surrounding delivery tube 14 and driver 16. Heater 18 may comprise, for example, ¾" heat tape such as that produced by Conrad Industries of Columbus Ohio, which is powered by a 120V power supply, not shown. Heater 18 may be coupled to temperature controller 20. Alternatively, droplet generator 100 may be placed in a heated chamber, which will obviate the need for separate heater 18.

Tube 14 terminates in an orifice 22 through which liquid contents of tube 14 may be forced to emerge in droplet form. Tube 14 is preferably made of non-wettable metal, such as 316 stainless steel. Orifice 22 may comprise, for example, a jeweled (sapphire, ruby, etc.) orifice such as that manufactured by Byrd Precision, Waltham, Mass. The internal diameter of tube 14 is preferably greater than the internal diameter of orifice 22. This facilitates the delivery of the fluid to the orifice.

Driver 16 in the embodiment depicted in cross-section in FIG. 3 operates on current-to-current excitation principles, and is detailed in FIG. 3A, which is a cross-section of driver 16 along plane 3A—3A. As shown in FIG. 3A, pulsed current (I) from a current source (power supply 17) enters conductive strip 44 as indicated. The current then traverses through conductive strip 44 and exits as shown. Conductive strip 44 may be any conductive material that can withstand high temperatures, such as copper or platinum foil. Sandwiched in between windings of conductive strip 44 is insulating material 45. A suitable insulating material is ceramic woven tape such as that produced by Cotronics Corp., Brooklyn, N.Y.

Power supply 17 supplies pulsed current to strip 44, preferably in the range of several hundred to over 1,000 amps at very low voltage, i.e., less than 1 volt. Because strip 44 is wound back upon itself, opposing, pulsed current forces are generated that tend to cause the windings of the strip to repel against each other. These opposing forces are contained by force retention member 46, which is an acoustically-tuned, force retaining ring that may be comprised of stainless steel, for example. This results in acoustic waves, which are echoed as pressure pulses back toward the center of delivery tube 14, where the pulses in turn cause the pressure and velocity of the liquid jet stream in delivery tube 14 to vary. This variance generates capillary waves on the liquid jet stream, which ultimately cause the jet stream to break into regularly-sized and regularly-spaced droplets upon exiting orifice 22. The spacing of the droplets may be predicted accurately from the frequency of the pulsed current source. The size of the droplets may also be predicted accurately if the velocity of the liquid jet stream and the internal diameter of orifice 22 is known in addition to the frequency of the pulsed current source. (See Eq. 1.)

Drop-on-Demand Mode

Figure 4:
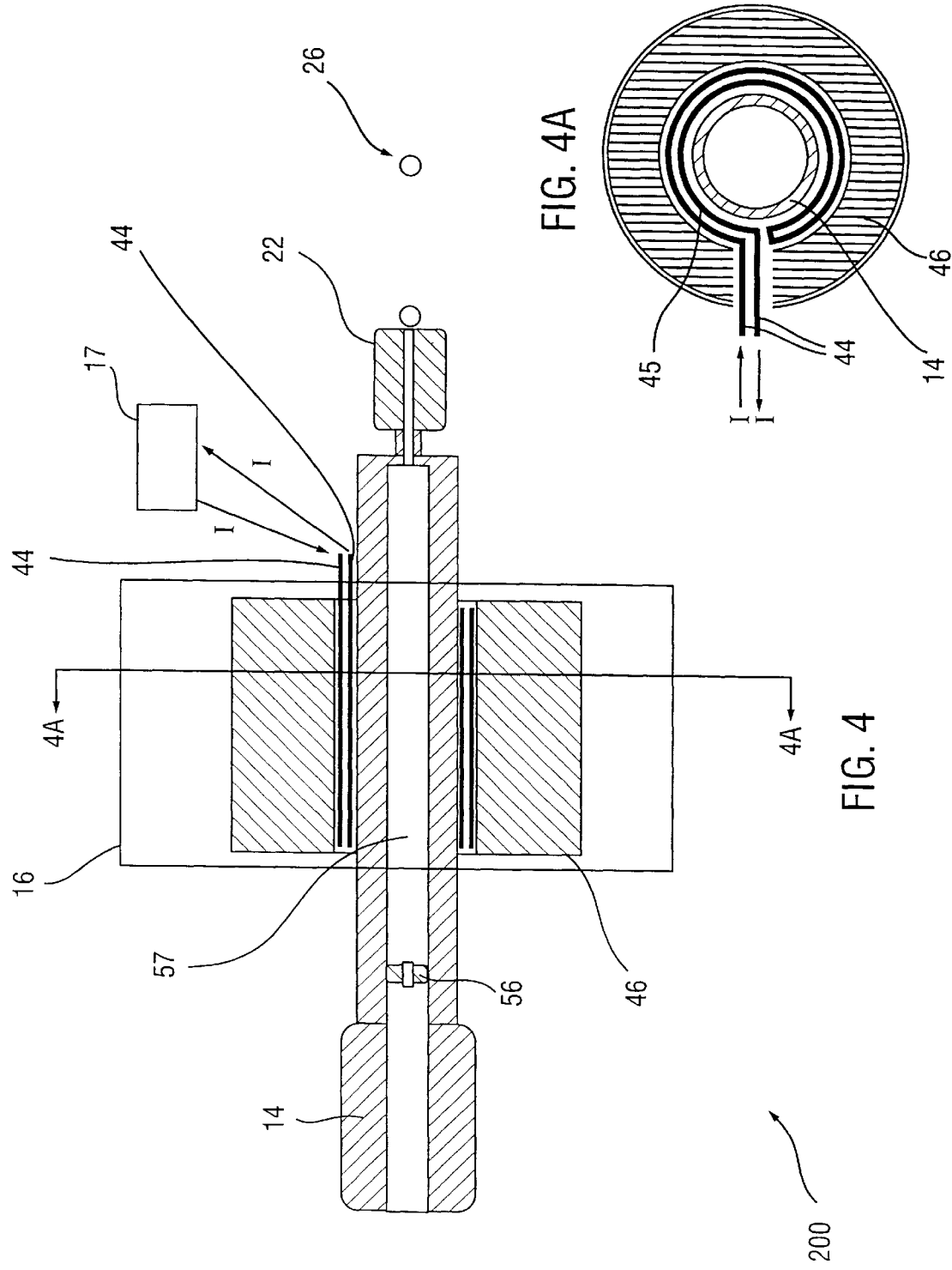
FIG. 4 is a schematic representation of a drop-on-demand electromechanical droplet generator using current-to-current excitation according to the present invention.

FIG. 4 is a schematic representation of a drop-on-demand electromechanical droplet generator using current-to-current excitation according to the present invention. Droplet generator 200 operates on the same basic principles as described for droplet generator 100 of FIG. 3. However, single droplets are produced on demand instead of a continuous stream of regularly spaced droplets. Power supply 17 supplies a single, large pulse of current on demand to driver 16. The current pulse enters conductive strip 44 of driver 16, a cross-section of which is shown in FIG. 4A. Opposing current forces are created as described above. This results in a large, single force that is reflected by acoustic retaining ring 46 toward tuned fluid chamber 57 as a pressure pulse. This pulse in turn causes a quantity of liquid to be moved through fluid chamber 57 and to be expelled from orifice 22, which is coupled to tuned fluid chamber 57. Surface tension on the liquid causes the liquid to assume a spherical shape (droplet) within a brief period after exiting orifice 22.

Flow restricting orifice 56 positioned within delivery tube 14 creates tuned fluid chamber 57 between orifice 56 and exit orifice 22. Flow restricting orifice 56 prevents an excessive quantity of liquid to be ejected from tuned fluid chamber 57 in a direction opposite to the desired direction (i.e., through orifice 22). The quantity of liquid ultimately expelled through orifice 22 may be predicted from the change in the volume of tuned fluid chamber 57, internal diameter of orifices 22 and 56, and from the size of the current pulse applied from power supply 17 to driver 16. It is preferred that the volume of the fluid chamber be such as to optimally convert mechanical force and energy into velocity and kinetic energy of the ejected droplet.

It is also preferred that a heat source (not shown in FIG. 4) be provided to maintain the contents of delivery tube 14 in a heated state, as shown in FIG. 3.

Electromechanical Direct-Coupled Excitation

Continuous Mode

Figure 5:
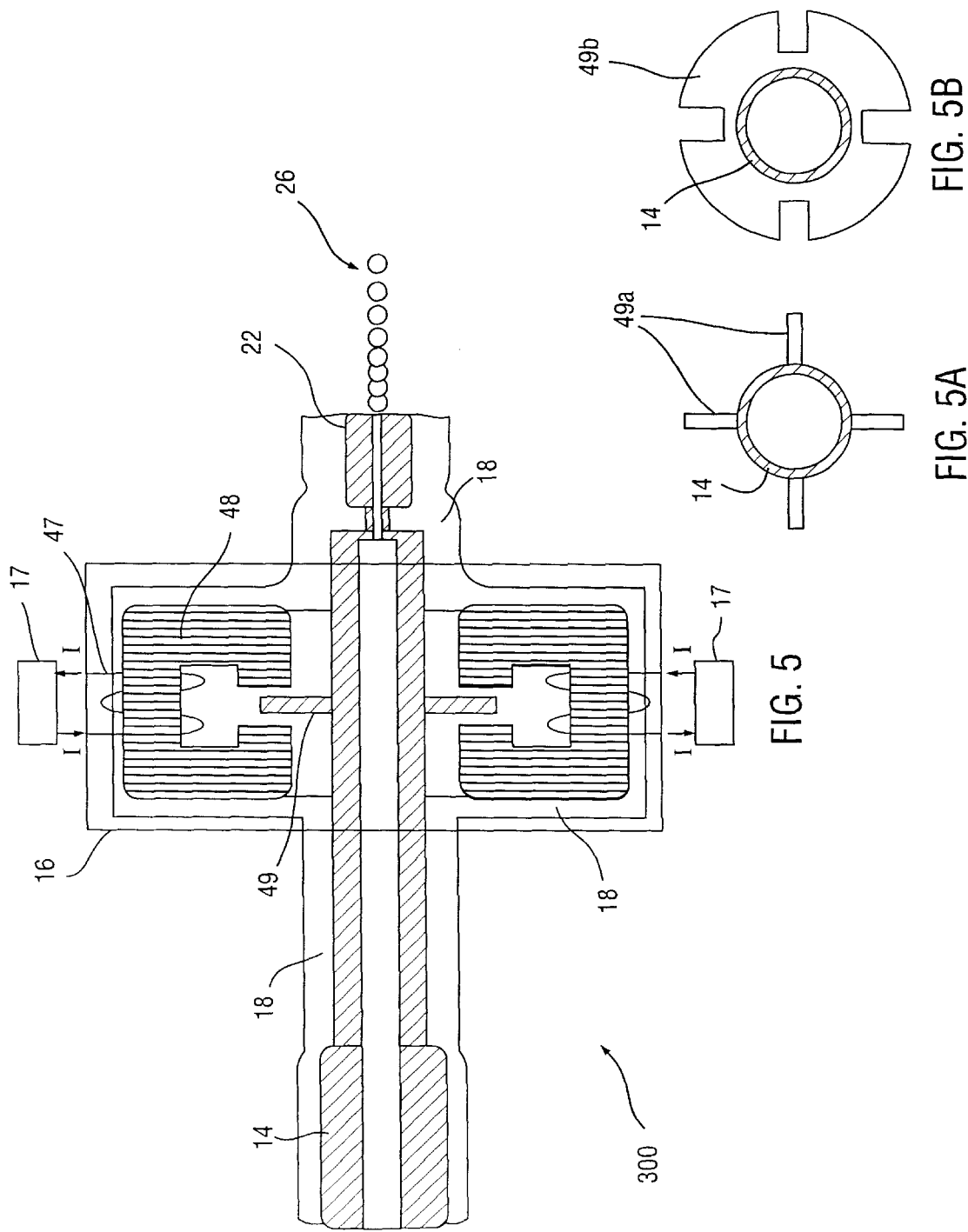
FIG. 5 is a schematic representation of a continuous, electromechanical direct-coupled droplet generator using current-to-magnetic-material excitation according to the present invention.

FIG. 5 is a schematic representation of a continuous, electromechanical direct-coupled droplet generator 300 using current-to-magnetic-material excitation according to the present invention. Driver 16 comprises electromagnetic coil yoke 48 (shown in cross section in FIG. 5), which may comprise a single coil, or a plurality of coils placed in symmetrical spacing about the circumference of delivery tube 14. Electromagnetic coil yoke 48 is preferably comprised of soft magnetic steel. Coil yoke 48 is gapped to receive armature 49. As shown in FIG. 5A, armature 49 may comprise, for example, tabs 49a of soft magnetic material coupled to the exterior of delivery tube 14. Another suitable embodiment for armature 49 is notched ring 49b (FIG. 5B) coupled to the exterior of delivery tube 14. It is preferred that the tabs or notches be symmetrical about the circumference of delivery tube 14.

A current source (power supply 17) supplies pulsed current to current windings 47. Each pulse causes an electromagnetic effect whereby armature 49 will be drawn radially outward toward electromagnetic coil yoke 48, in turn causing delivery tube 14 to bulge in the area proximate to armature 49. The bulging of delivery tube 14 causes the pressure and velocity of a liquid within that tube to change, inducing a capillary wave on the liquid jet stream. This in turn induces droplets to form on the liquid jet stream shortly after the jet exits orifice 22, as described above. For use with liquid metals and solders, it is preferred that droplet generator 300 be maintained in a suitably heated state. Toward that end, heater 18 may surround droplet generator 300. Other means of heating droplet generator 300 are mentioned above.

Drop-on-Demand Mode

Figure 6:
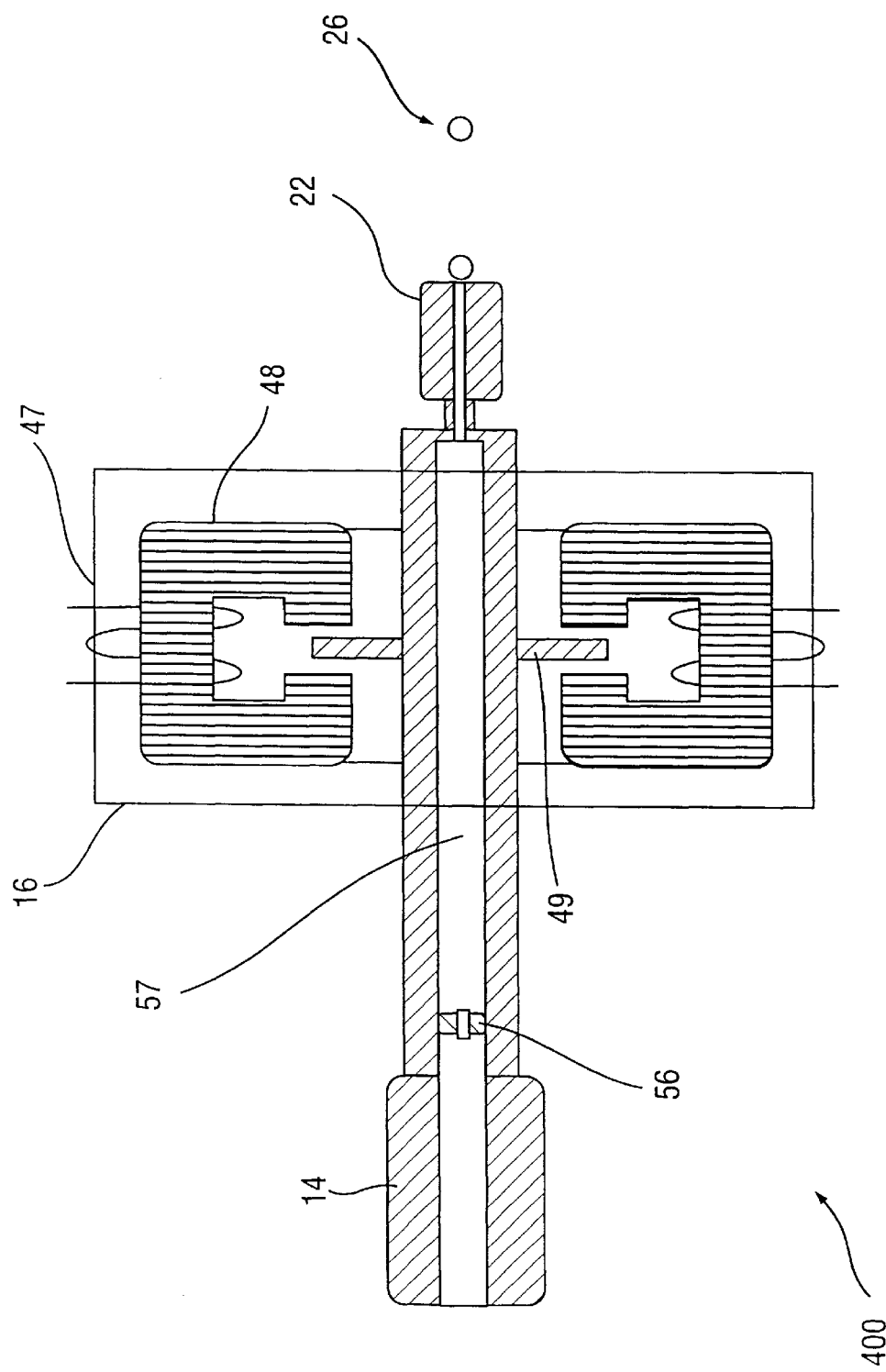
FIG. 6 is a schematic representation of a drop-on-demand electromechanical direct-coupled droplet generator using current-to-magnetic-material excitation according to the present invention.

FIG. 6 is a schematic representation of a drop-on-demand electromechanical direct-coupled droplet generator using current-to-magnetic-material excitation according to the present invention. Droplet generator 400 operates on the same basic principles as described for droplet generator 300 of FIG. 5. However, single droplets are produced on demand instead of a continuous stream of regularly spaced droplets.

Power supply 17 supplies a single, large pulse of current on demand to current windings 47 of driver 16. This causes electromagnetic coil yoke 48 to draw armature 49 radially outward, as described above, creating a single perturbation force on the liquid within tuned fluid chamber 57. This force in turn causes a quantity of liquid to be moved through fluid chamber 57 and to be expelled from orifice 22, which is coupled to tuned fluid chamber 57. Surface tension on the liquid will cause the liquid to assume a spherical shape (droplet) within a brief period after exiting orifice 22. Configurations for armature 49 may be as shown in FIGS. 5A and 5B.

Flow restricting orifice 56 positioned within delivery tube 14 creates tuned fluid chamber 57 between orifice 56 and exit orifice 22. Flow restricting orifice 56 prevents an excessive quantity of liquid to be ejected from tuned fluid chamber 57 in a direction opposite to the desired direction (i.e., through orifice 22).

It is also preferred that a heat source (not shown in FIG. 6) be provided to maintain the contents of delivery tube 14 in a heated state, as shown in FIG. 5.

Magnetostriction Excitation

Continuous Mode

Figure 7:
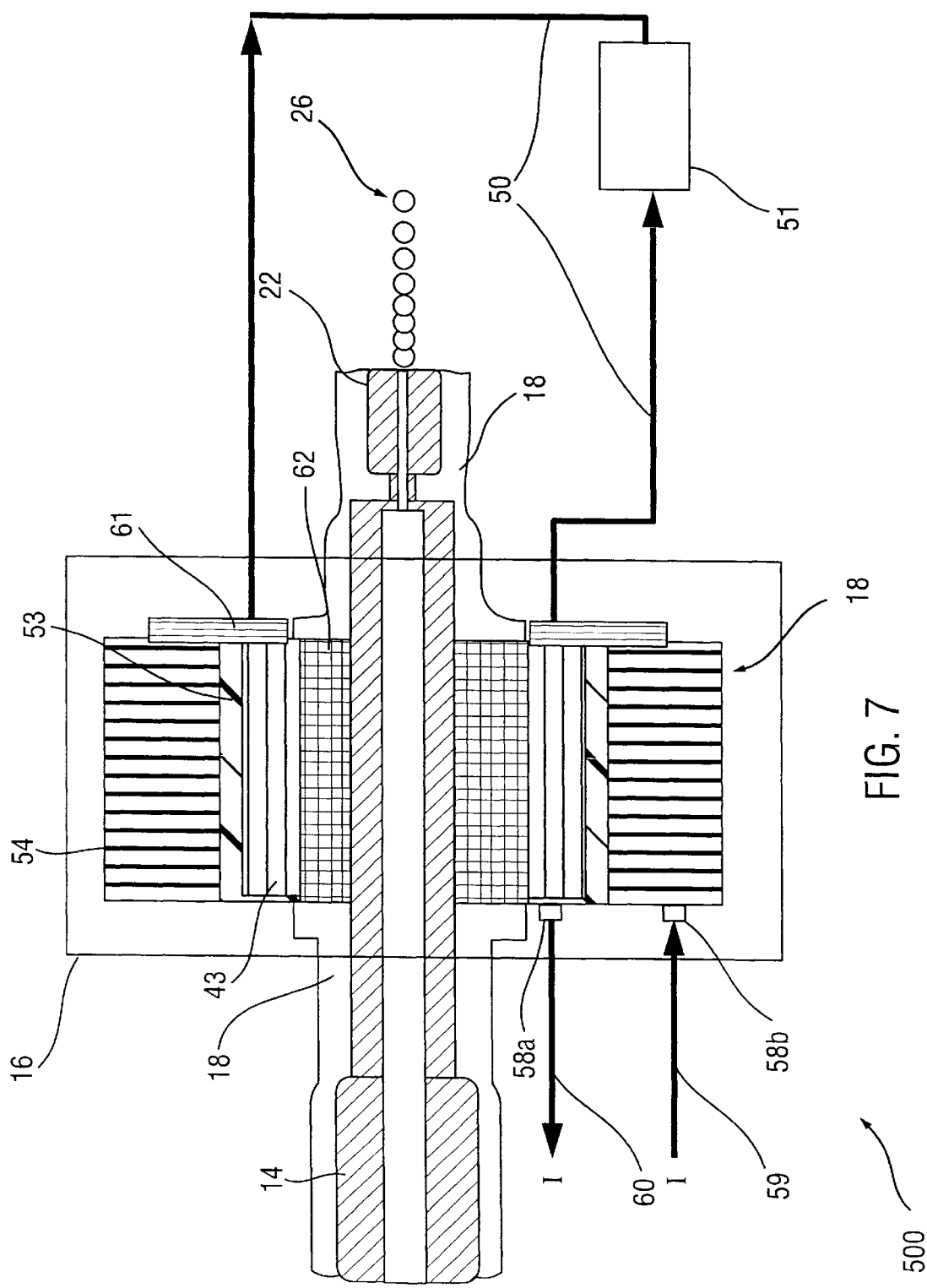
FIG. 7 is a schematic representation of a continuous, thermally-cooled droplet generator using magnetostriction excitation according to the present invention.

FIG. 7 is a schematic representation of a continuous, thermally-cooled droplet generator 500 using magnetostriction excitation according to the present invention. Driver 16 (shown in cross section) is coupled to liquid delivery tube 14, and comprises insulator 62, which is an acoustically conducting and thermally insulating material, such as glass, ceramic, etc. Coupled to insulator 62 is metal conductor 43. A dimension-changing means (magnetostrictive cylinder 53) is sandwiched between metal conductors 43 and 54. Conductor 54 also functions as an acoustically tuned backing ring in the manner described with reference to FIG. 3. Conductors 43 and 54 may comprise stainless steel, for example.

As described in the Background portion of this specification, magnetostrictive elements are sensitive to heat. Heater 18 is thermally coupled to delivery tube 14 to maintain the contents of the tube in a heated or molten (liquid) state. To avoid overheating the magnetostrictive element, however, heater 18 is preferably not in direct contact with driver 16. Additionally, according to the present invention, magnetostrictive cylinder 53 may be cooled by drawing heat away from magnetostrictive cylinder 53 through conductors 43 and 54 to thermally electric tap ring 61. Tap ring 61 in turn is coupled to heat conduit 50, which draws heat to thermal electric cooler 51, such as that manufactured by Marlow Industries of Dallas, Tex. The concept of thermal electric cooling is detailed in Direct Energy Conversion by Stanley August (1971) at pp. 153–57, the disclosure of which is herein incorporated by reference. Other suitable heat sinks may be accomplished by traditional methods known to those of skill in the art, including convective fluids, heat pipes, evaporative heat transfer, and thermal electric refrigeration.

To generate droplets, pulsed current is supplied from a power supply (not shown) to current inlet 59, which is coupled to backing ring 54 through electrical contact 58a. Current exits from conductor 43 through contact 58b to current outlet 60. This produces a magnetic field along the circumferential axis of the delivery tube. On each current pulse, magnetostrictive cylinder 53 changes dimensions in response to the magnetic field, causing a perturbation force to act through conductor 43 and insulator 62 (which is acoustically conducting) and on delivery tube 14. This force causes a disturbance on the liquid jet stream in the manner described above, breaking the jet stream into uniformly-sized and uniformly-spaced droplets 26 shortly after the jet stream exits orifice 22.

Drop-on-Demand Mode

Figure 8:
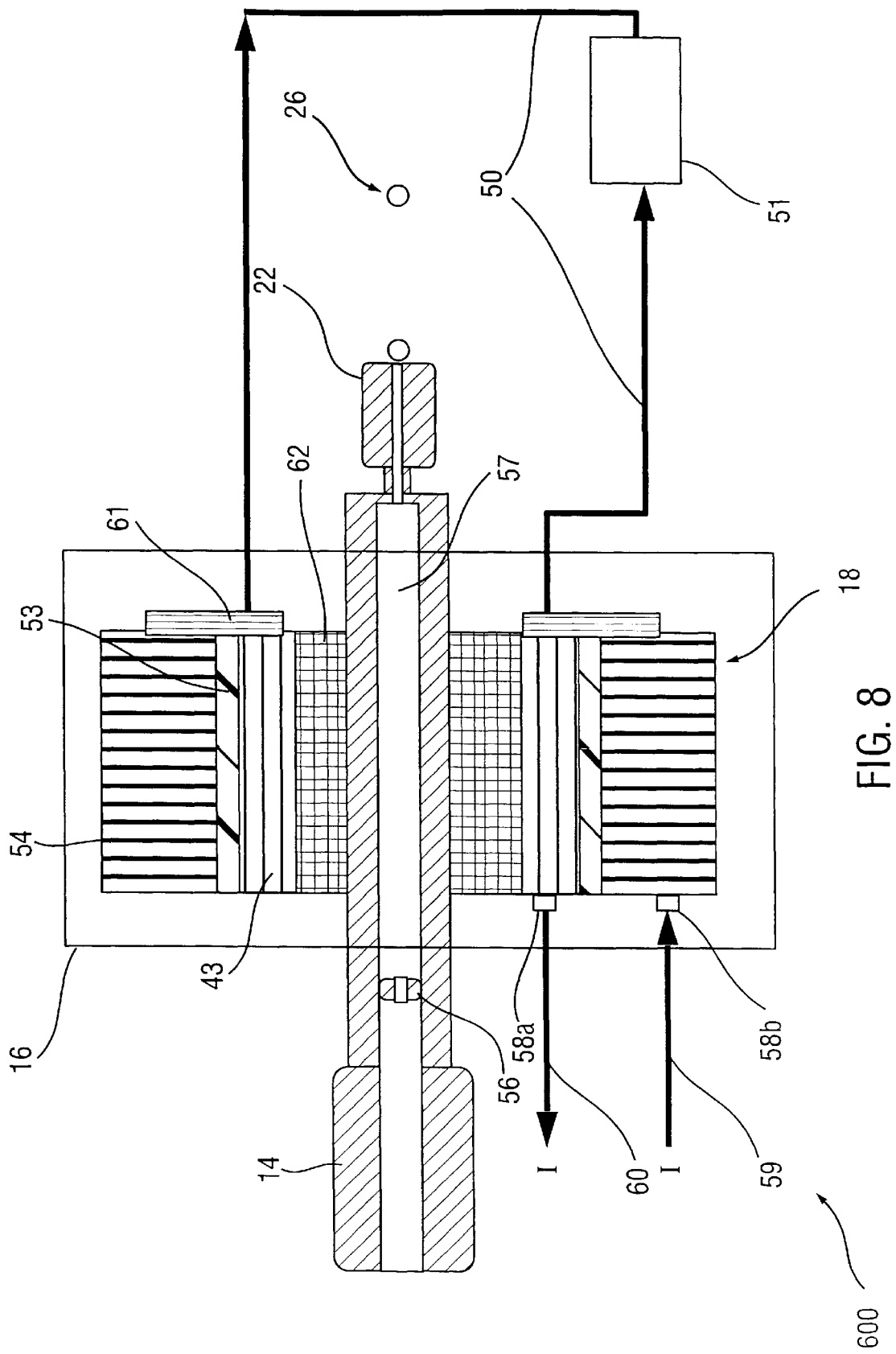
FIG. 8 is a schematic representation of a drop-on-demand thermally-cooled droplet generator using magnetostriction excitation according to the present invention.

FIG. 8 is a schematic representation of a drop-on-demand thermally-cooled droplet generator 600 using magnetostriction excitation according to the present invention. Driver 16 of droplet generator 600 operates on the same basic principles as described for droplet generator 500 of FIG. 7. However, single droplets 26 are produced on demand in response to a single, large pulse of current from power supply 17, instead of a continuous stream of regularly spaced droplets.

Flow restricting orifice 56 positioned within delivery tube 14 creates tuned fluid chamber 57 between orifice 56 and exit orifice 22. Flow restricting orifice 56 prevents an excessive quantity of liquid to be ejected from tuned fluid chamber 57 in a direction opposite to the desired direction (i.e., through orifice 22).

It is also preferred that a heat source (not shown in FIG. 8) be provided to maintain the contents of delivery tube 14 in a heated state, as shown in FIG. 7.

Magnetohydrodynamic Excitation

Figure 9:
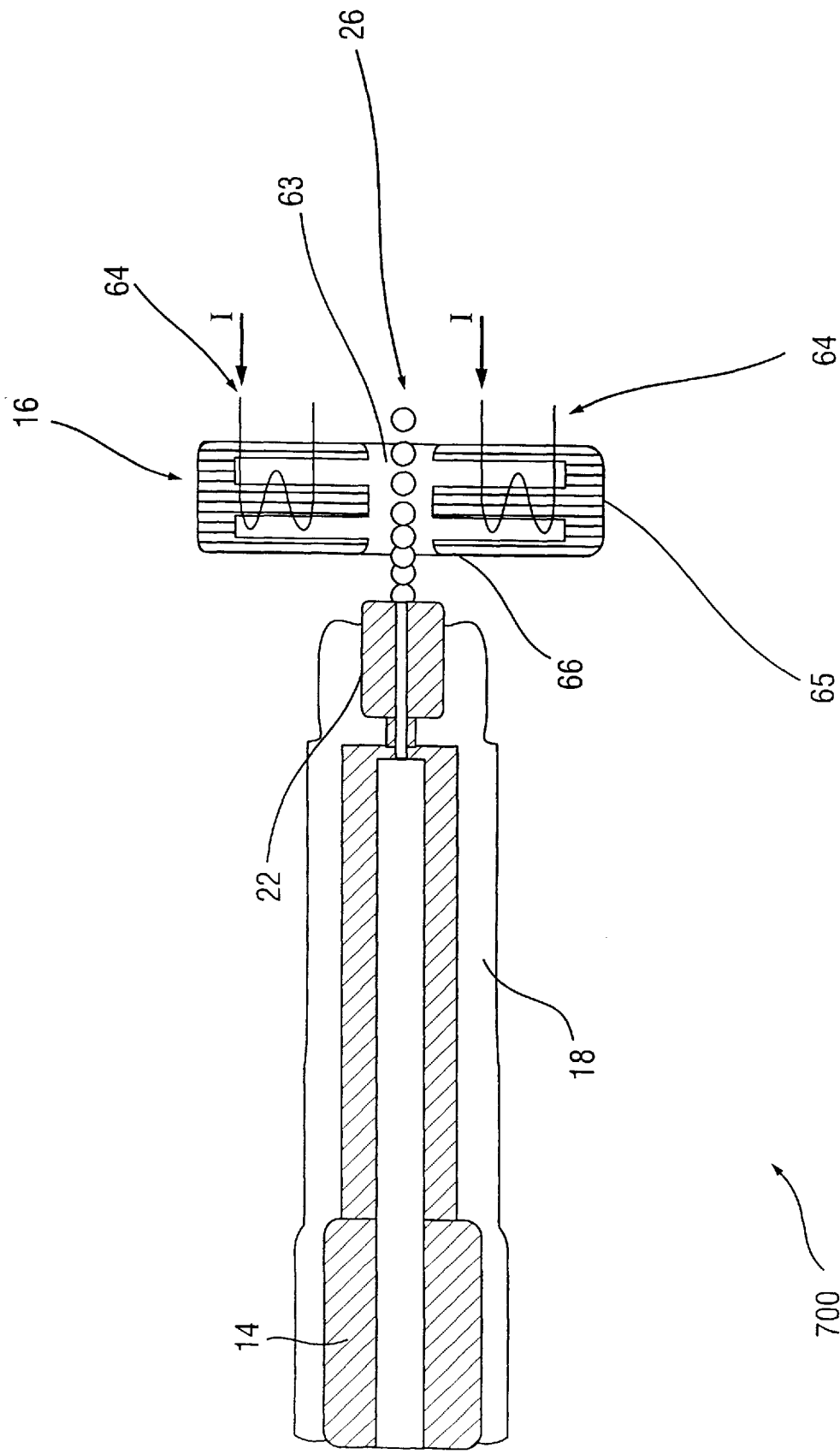
FIG. 9 is a schematic representation of a continuous droplet generator using magnetohydrodynamic excitation according to the present invention.

FIG. 9 is a schematic representation of a continuous droplet generator 700 using magnetohydrodynamic excitation according to the present invention for use with conductive liquids. Driver 16 is not coupled to delivery tube 14, but instead acts directly on the liquid jet stream that is expelled from orifice 22. Driver 16 comprises magnetic field yoke 65 which has spacings between arms 66. Arms 66 correspond to points of field intensity maximums in the magnetic field generated when current is applied from a power supply (not shown) to current windings 64. The current supplied may be DC or AC.

The liquid jet stream passes from orifice 22 through air gap 63 in magnetic field yoke 65. The periodic magnetic field acts upon the jet stream, producing perturbations of maximum strength on the surface of the jet stream corresponding to field intensity maximum points (focal points). These perturbations are amplified by the jet physics causing the jet to break up into droplets of uniform size and uniform spacing when the jet velocity satisfies a synchronous condition. A synchronous condition has been found to exist when the maximum spacing between points of maximum field intensity is approximately about 8.98 times the radius of the exit orifice. The spacing between droplets, in turn, may be predicted from the spacing of the magnetic focal points (i.e., from the spacing between arms 66) and the velocity of the liquid jet stream.

Piezoelectric Excitation

Continuous Mode

Figure 10:
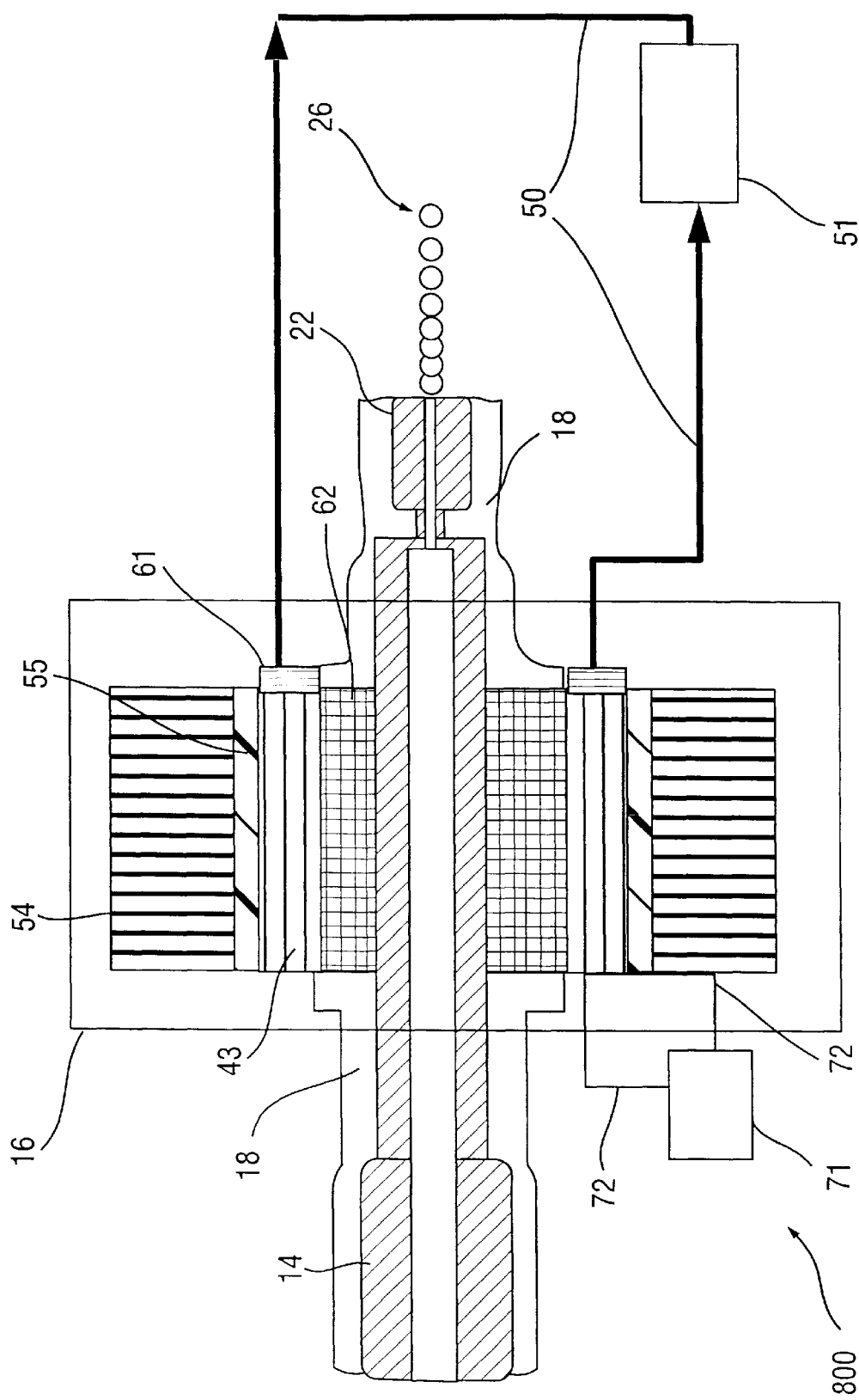
FIG. 10 is a schematic representation of a thermally-cooled, continuous droplet generator using piezoelectric excitation according to the present invention.

FIG. 10 is a schematic representation of a thermally-cooled, continuous droplet generator 800 using piezoelectric excitation according to the present invention. Driver 16 (shown in cross section) is coupled to liquid delivery tube 14, and comprises insulator 62, which is an acoustically conducting and thermally insulating material, such as glass, ceramic, etc. Coupled to insulator 62 is metal conductor 43. A dimension-changing means (piezoelectric crystal 55) is sandwiched between metal conductors 43 and 54. Conductor 54 also functions as an acoustically tuned backing ring in the manner described with reference to FIG. 3.

Power supply 71 supplies pulsed voltage through connections 72 to conductors 43, 54 of driver 16. This voltage pulse is transmitted through the conductors to piezoelectric crystal 55, which changes dimensions in response to the resulting electric field. The change in dimensions produces a force, which is coupled through acoustical conductor 62 to delivery tube 14. This in turn results in a perturbation on the fluid jet stream in delivery tube 14, causing the jet stream to break into uniformly-sized and uniformly-spaced droplets shortly after exiting orifice 22.

Heater 18 is used delivery tube 14 to maintain the contents of the tube in a heated or molten (liquid) state. To avoid overheating the piezoelectric crystal, however, heater 18 is preferably not in direct contact with driver 16. As described in connection with FIG. 7, piezoelectric crystal 55 may be cooled by drawing heat away from piezoelectric crystal 55 through conductors 43 and 54 to thermally electric tap ring 61. Tap ring 61 in turn is coupled to heat conduit 50, which draws heat to thermal electric cooler 51.

The thickness required of thermal insulator 62 in each embodiment using a piezoelectric crystal or magnetostrictive element (FIGS. 7, 8, 10, and 11) depends on its thermal efficiency and the temperature difference between tube 14 and heat exchanger 43, as well as allowable heat flux from tube 14 to piezoelectric crystal 55 or magnetostrictive element 53 (allowable steady state heat flux being limited by the maximum operating temperature of piezoelectric crystal 55 or magnetostrictive element 53 and the maximum steady state heat rejection from crystal 55 or element 53 to backing ring 54). Depending on the heat rejection capability of piezoelectric crystal 55 or magnetostrictive element 53 and the efficiency of thermal insulator 62 or first heat exchanger 43, some embodiments of the invention may require only thermal insulator 62 or first heat exchanger 43 alone, but not both.

Drop-on-Demand Mode

Figure 11:
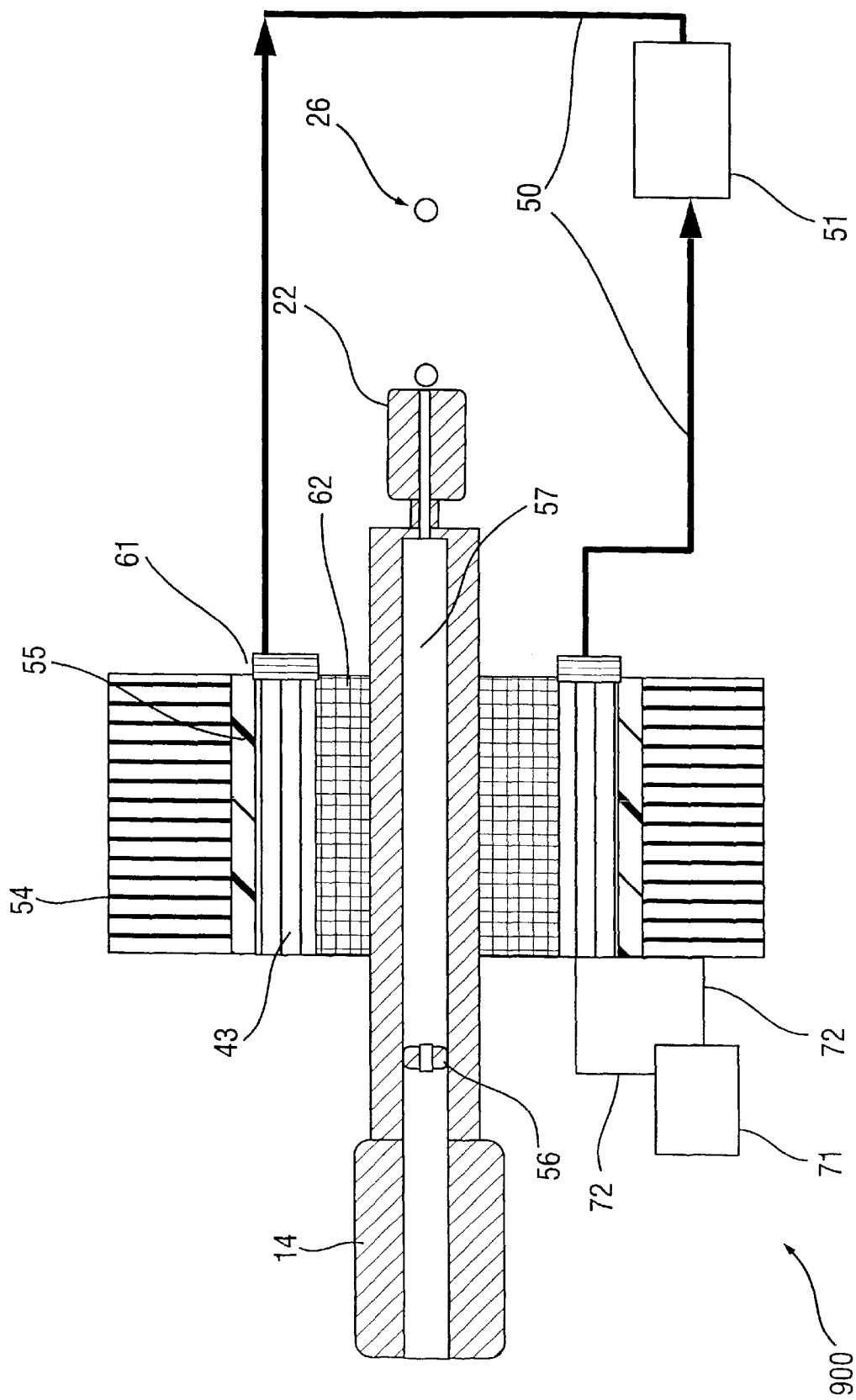
FIG. 11 is a schematic representation of a thermally-cooled, drop-on-demand droplet generator using piezoelectric excitation according to the present invention.

FIG. 11 is a schematic representation of a thermally-cooled, drop-on-demand droplet generator 900 using piezoelectric excitation according to the present invention. Droplet generator 900 operates on the same basic principles as described for droplet generator 800 of FIG. 10. However, single droplets are produced on demand instead of a continuous stream of regularly spaced droplets. Power supply 71 supplies a single, large pulse of voltage through electrical connections 72 on demand to conductors 43, 54 of driver 16. This voltage pulse is transmitted through the conductors to piezoelectric crystal 55, which changes dimensions in response to the resulting electric field. This in turn results in a large, single force that is reflected by backing ring 54 toward tuned fluid chamber 57, causing a quantity of liquid to be moved through fluid chamber 57 and to be expelled from orifice 22, which is coupled to tuned fluid chamber 57. Surface tension on the liquid will cause the liquid to assume a spherical shape (droplet) within a brief period after exiting orifice 22.

Flow restricting orifice 56 positioned within delivery tube 14 creates tuned fluid chamber 57 between orifice 56 and exit orifice 22. Flow restricting orifice 56 prevents an excessive quantity of liquid to be ejected from tuned fluid chamber 57 in a direction opposite to the desired direction (i.e., through orifice 22).

It is also preferred that a heat source (not shown in FIG. 11) be provided to maintain the contents of delivery tube 14 in a heated state, as shown in FIG. 10.

Vertical Trajectory Jetting for Spherical Microball Formation

Figure 12:
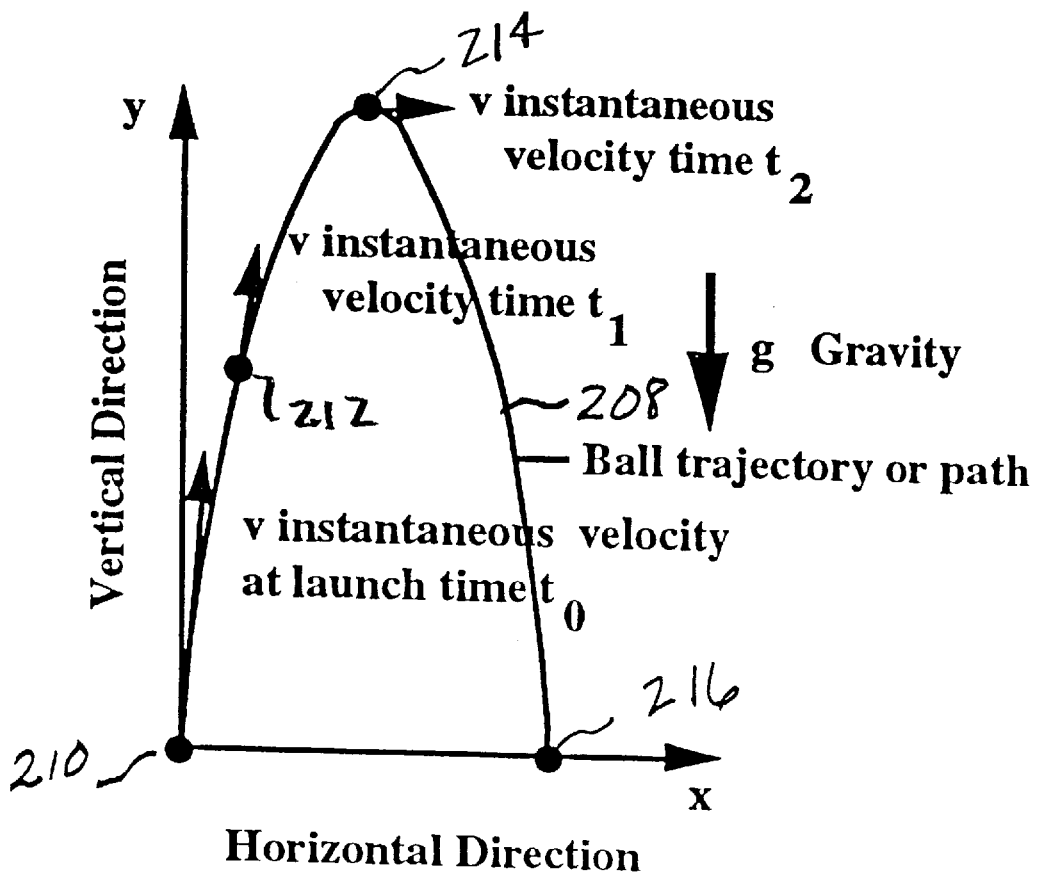
FIG. 12 is a graphical representation of droplet trajectory according to one embodiment of the present invention.

FIG. 12 is a graphical representation of droplet trajectory according to one embodiment of the present invention. The trajectory path depicted in FIG. 12 is used to control the natural instability of a continuous, thin liquid jet of molten metal or other material to create a moving stream of liquid drops of uniform volume, spherical shape, and material properties. While these droplets are in free flight along the trajectory path 208, surface tension acts to form essentially perfectly spherical shapes (microspheres) that solidify due to controlled heat transfer or other energy transfer to the environment containing the flight path. In the embodiment represented in FIG. 12, a droplet travels along a flight path trajectory having a vertical component (in the Y direction) and a horizontal component (in the X direction). Each droplet also has an instantaneous velocity component at any given point along the trajectory path. This velocity component is a function of elapsed time (i.e., relative to droplet launch time at point 210), or a function of position along the trajectory path 208.

In the trajectory path represented by FIG. 12, a moving stream of liquid drops is launched or "jetted". At launch time, $t_0$, the droplet stream has an instantaneous launch velocity. At time $t_1$ (point 212) the droplet stream has a reduced instantaneous velocity and a horizontal displacement in the positive X direction from launch point 210. At time $t_2$, the droplet stream is located at point 214 and has an instantaneous velocity of zero, having been slowed by the force of gravity and possibly viscous drag as a result of the gaseous or liquid atmosphere. Unhampered, the droplet stream will continue along the trajectory path 208 to trajectory path termination point 216.

To prevent collisions during free flight and to aid in forming the desired spherical shape each liquid drop may be given a specific electric charge just as the droplet detaches from the tip of the thin, continuous jet at point 210. This electric charge acts strongly to prevent individual droplets and, at later times in the trajectory, individual solid balls, from mechanically contacting one another. The environment containing the free flight trajectory is arranged to provide a stable trajectory and energy transfer medium for the solidification of the liquid drops into the desired spherical solid balls.

Using this embodiment of the present invention uniform, spherical balls (microspheres) may be collected without suffering mechanical or metallurgical damage during the collection process. This is accomplished by two mechanisms. First, the trajectory of the liquid drops and after solidification, the solid spherical balls or microspheres, is arranged such that gravity acts to bring the value of the vertical component of motion to zero (or nearly zero) at or about the point of maximum height 214 achieved by the stream of liquid drops and solid spherical balls. Second, the initial direction of the stream at point 210 is set close to vertical to ensure the minimum horizontal component of motion at the maximum height point 214 of the trajectory. Other configurations that allow collection of the microspheres at a minimum velocity are also suitable. For example, the microspheres may be deployed horizontally and allowed to travel a long distance, to the point of minimum velocity, before being caught. Also, the balls may be deployed upward in more of an arc formation. The microspheres, which are electrically charged, are collected electrostatically (see FIG. 13) at the point of maximum height and minimum speed 214 and conveyed away from the stream trajectory. In this embodiment, the minimum speed of the microsphere and the electrostatic collection process combine to yield microspheres of desired perfection. Other collection schemes are also possible to implement at the catch point 214 of the trajectory, including but not limited to, liquid stream, air movement, and conveyor-based collection systems.

By applying electrostatic charges to the droplets as they are separated from the liquid jet, the formation of uniform and essentially perfectly spherical balls (microspheres) of metals, alloys and other materials is promoted. In addition, collisions between droplets and/or balls during free flight may be prevented. Finally, when the microspheres are electrically charged, they may be collected electrostatically at a point of choice along the trajectory path 208. A nearly vertical trajectory coupled with electrostatic collection of a stream of solid balls at the point of minimum velocity 214 facilitates collection of microspheres without damage.

To promote solidification of liquid drops into solid microspheres in one method according to the present invention, very cold nitrogen gas (e.g., from about −184° C. to about −34° C.) is typically applied to the droplet stream in a flow direction counter-current to the movement of the stream. For example, nitrogen gas obtained from a source of liquid nitrogen may be applied in a flow along the droplet stream trajectory and in a direction from the point of maximum height and minimum speed 214 to the launch point 210 to solidify metal droplets into spherical solid balls. Although very cold nitrogen gas is typically employed, other gases and energy transfer media may be used including, but not limited to, argon (either gas or liquid). In addition, an energy transfer medium may be applied in a direction concurrent to the direction of the droplet stream, or a static energy transfer medium may also be employed (i.e., in a condition of no flow).

Figure 13:
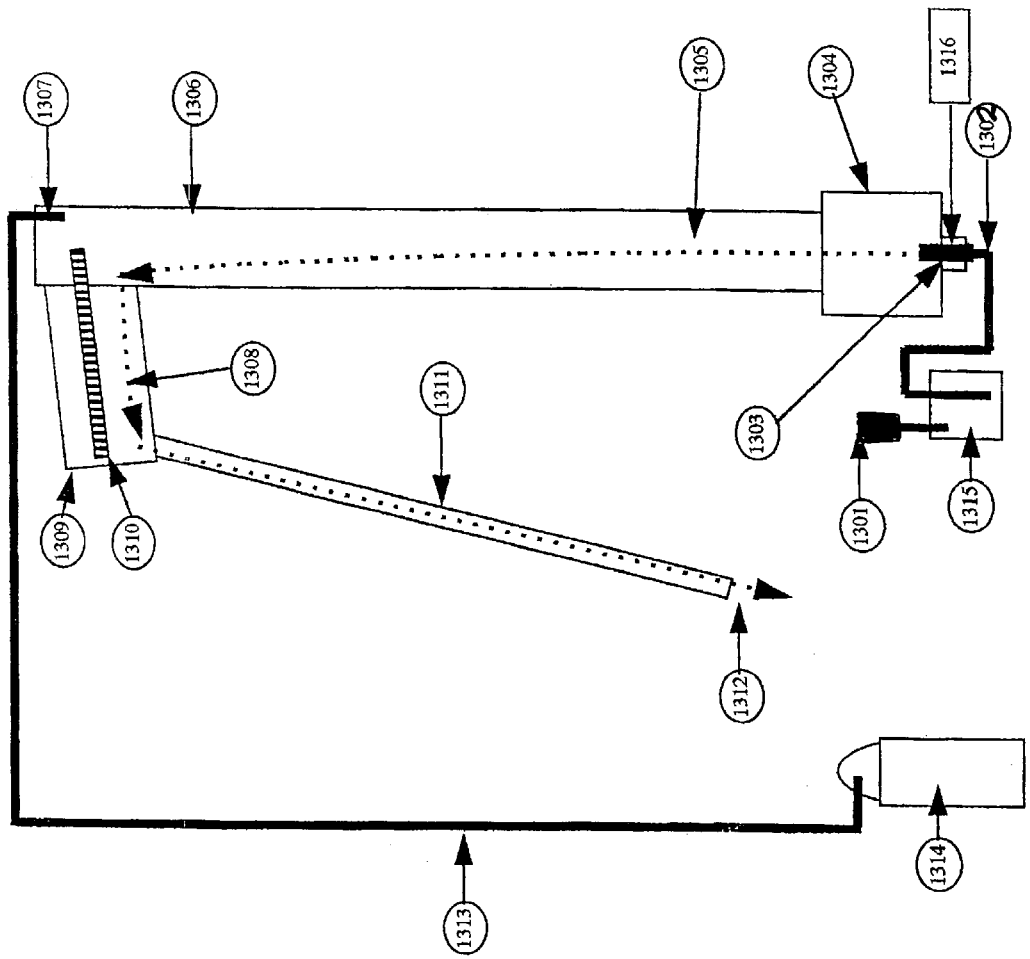
FIG. 13 is a schematic representation of one embodiment of an apparatus for creating essentially spherical microballs, or microspheres, according to the present invention, including a droplet generator, a vertical flight path chamber, and an electrostatic microsphere catcher.
Figure 14:
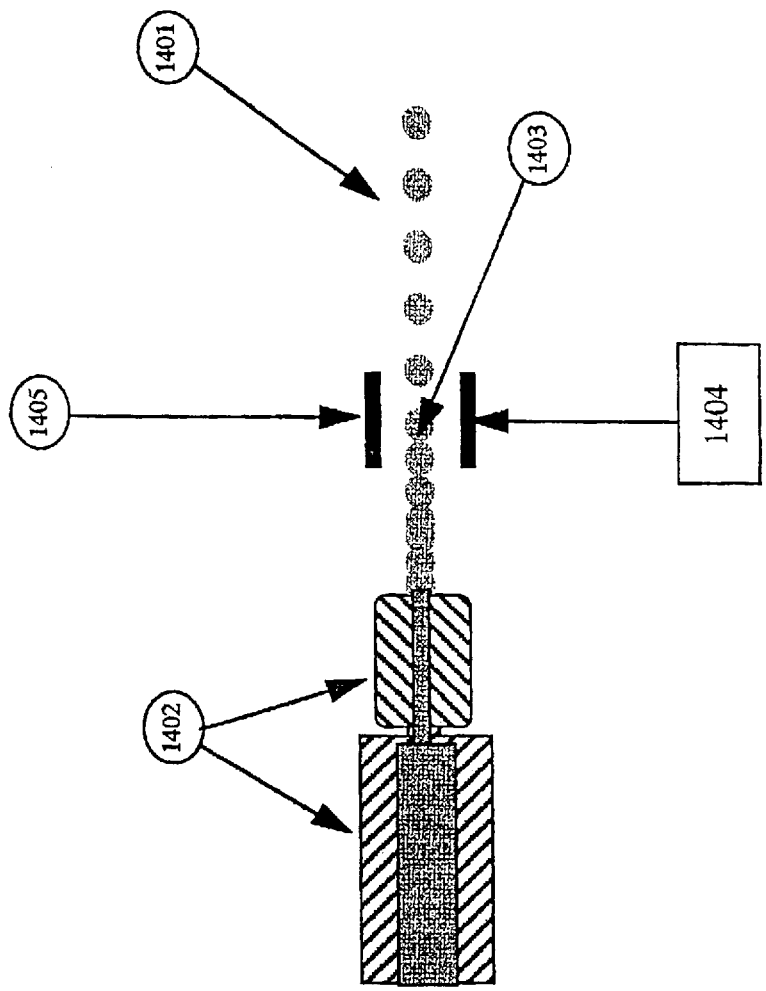
FIG. 14 is a schematic representation of one embodiment of an apparatus for charging liquid droplets according to one embodiment of the present invention.

FIG. 13 is a schematic representation of one embodiment of an apparatus for creating essentially spherical microballs, or microspheres, according to the present invention. As shown in FIG. 13, the apparatus comprises droplet generator 1303, sealed environmental chamber 1306, and electrostatic microsphere transport system 1310. A high pressure inert gas, such as nitrogen, is introduced from source 1301 into pressure vessel 1315, which contains the liquid to be jetted and ultimately solidified; it may be, for example, a molten metal for jetting according to the techniques discussed herein. Source 1301 may be, for example, a 2000 psig cylinder of compressed gas, such as nitrogen gas, with a 0–300 psig primary regulator in series with a precision 2–150 psig secondary regulator. The liquid transfers through transfer tube 1302 to droplet generator 1303, which may be constructed according to various embodiments depicted in FIGS. 3–11. Suitable tubing for transfer tube 1302 includes a ¼-inch, 0.030-inch wall 316 stainless steel tubing with ¼-inch stainless steel Swagelok® fittings. Transfer tube 1302 may also be traced with model 202 flexible heat tape as supplied by Conrad Corp. The pressure head causes a thin jet of liquid to emit from droplet generator 1303 and to be broken up into droplets (as described herein), which are then charged by jet control system 1316 (the charging portion is shown in FIG. 14; see also FIGS. 3–11) and then accelerated into a nearly vertical path of charged droplets (or microspheres) 1305. Charged droplets 1305 travel through chilled, sealed optics chamber 1304, and then through chilled, sealed environmental chamber 1306 long enough to allow gravity to decelerate charged droplets 1305 to nearly zero velocity in the vertical direction. Sealed optics chamber 1304 may comprise, for example, an 18-inch stainless steel cube chamber with 1/16-inch walls and welded seams. Sealed environmental chamber 1306 may comprise, for example, a 12-inch diameter by 20 foot 304 stainless steel schedule pipe with 150# ANSI flanges fitted onto the bottom to connect to sealed optics chamber 1304. Sealed environmental chamber 1306 is preferably insulated with 2-inch-thick pipe insulation.

Electrostatic microsphere transport system 1310 is located in sealed transfer chamber 1309, and electrostatically holds the vertically positioned stream of charged, solid microspheres 1308 in an electronically stabilized position. Sealed transfer chamber 1309 may comprise, for example, an 18-inch stainless steel plenum with welded seams and 1/16-inch walls. Sealed transfer chamber 1309 has one end open to fit to the 12-inch pipe of sealed environmental chamber 1306 and the other end is fitted to attach to a 2-inch vent/exit pipe 1311. Sealed transfer chamber is preferably insulated with 2-inch-thick insulation. Electrostatic microsphere transport system 1310 (described in more detail in connection with FIG. 16) moves charged droplets 1305 through a horizontal direction by energizing alternate sections of a stacked array (see FIGS. 15 and 16), which produces a "moving" electric field in a linear fashion. Electrostatic transport system 1310 transports charged droplets 1305 to discharge chute 1311 to be collected at gas exhaust vent 1312 for use. Gas exhaust vent 1312 may comprise, for example, a 2-inch manual butterfly valve.

Cooling may be accomplished by many ways. An exemplary method is as follows. Pressurized liquid nitrogen storage dewer 1314 transfers liquid nitrogen through insulated transfer lines 1313 to dispersing nozzle 1307 inside sealed environmental chamber 1306. Transfer lines 1313 may comprise, for example, ¼-inch 0.030-inch wall 316 stainless steel tubing with ¼-inch 316 stainless steel Swagelok® fittings, and are preferably insulated with 2-inch-thick tubing insulation. Storage dewer 1314 may comprise, for example, a 60-liter dewer rigged for high pressure with a 350 psig relief valve. When the liquid nitrogen is dispersed from nozzle 1307, the liquid nitrogen is sprayed throughout the chamber, which causes the liquid to vaporize and subsequently to cool the insulated and sealed environmental chamber 1306. Nozzle 1307 may comprise, for example, a ¼-inch Swagelok® 316 stainless steel tube plug fitting drilled with three 0.025-inch holes.

FIG. 14 is a schematic representation of one embodiment of an apparatus for the electrostatic charging of liquid droplets or microspheres 1401. In one embodiment according to the present invention, liquid is issued from jetting system droplet generator 1402 (see FIGS. 3–11). At the precise location of the droplet break-off (represented by point 1403), DC voltage source 1404 (set at 125 volts, for example) is applied to charge electrodes 1405. Charge electrodes 1405 may comprise, for example, two 1-inch long ⅛-inch key stock steel bars fixed parallel to each other with a 0.040-inch gap between them and electrically shorted together. The bars are preferably positioned to have the liquid stream run between them and are preferably located to have the break-off occur in the middle of the gap. The resulting charged microspheres 1401 then travel towards the electrostatic microsphere transport system (see FIG. 15), as described above, while decelerating and cooling in flight.

Figure 15:
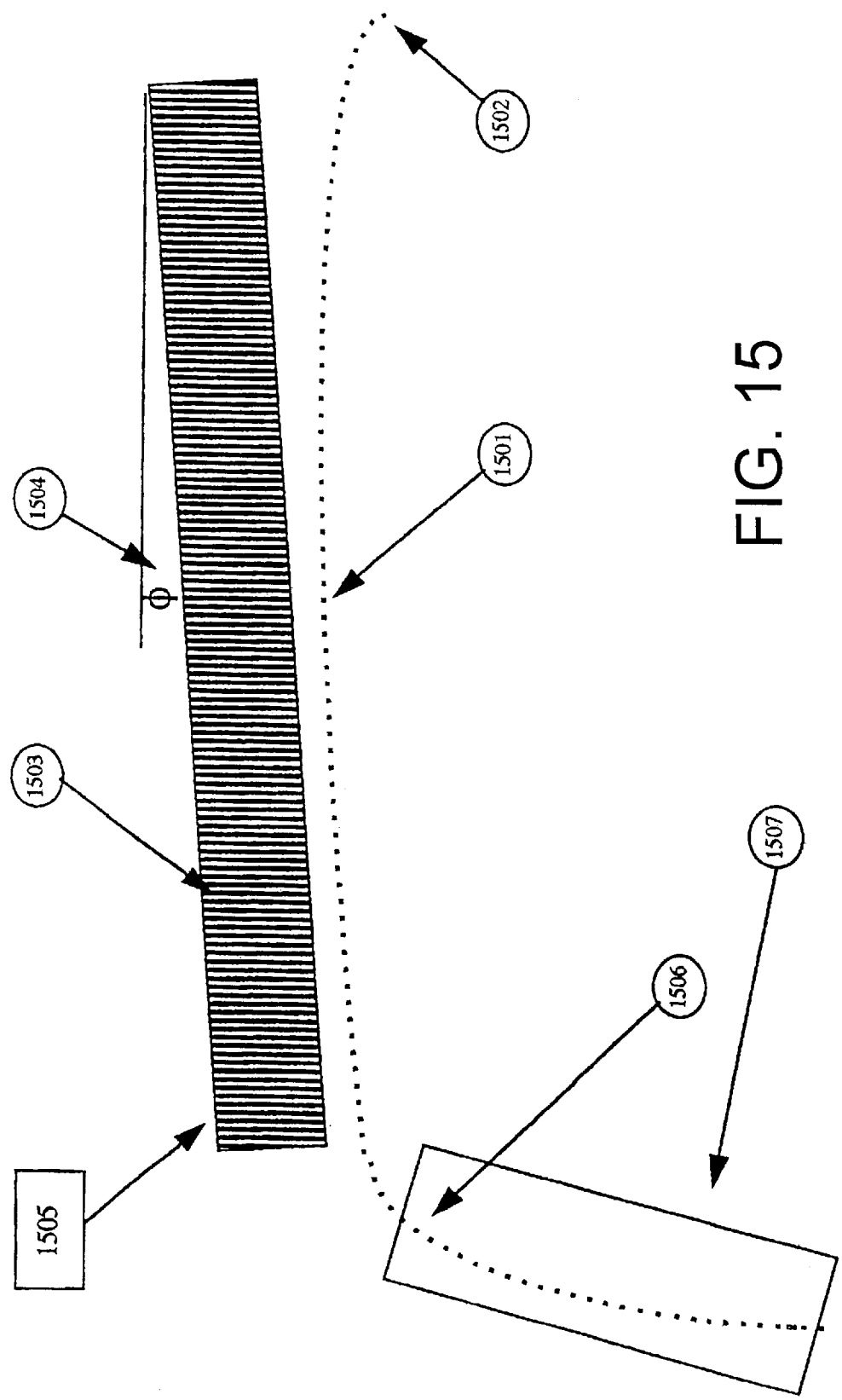
FIG. 15 is a schematic representation of one embodiment of an apparatus for the electrostatic transport of charged droplets according to the present invention.

FIG. 15 is a schematic representation of one embodiment of an apparatus for the electrostatic transport of charged microspheres 1501. As charged microspheres 1501 reach the top of the trajectory arc (represented by point 1502), the vertical velocity of the microspheres is near zero. Stacked bar array 1503 (described in more detail in connection with FIG. 16) is placed at angle φ (1504—typically 10–15 degrees from horizontal) and is energized sequentially by multi-phase power supply 1505 to provide a "traveling wave" electric field. Multi-phase power supply 1505 is a multi-phase pulse controller that triggers high voltage pulses to the stacked bar array sequentially. Power supply 1505 may comprise, for example, Opto 22® electronic relays, which are triggered sequentially by a sequencer or small programmable logic controllers to provide a 208-volt pulse to a step-up transformer with a final output of 1500 volts at 120 Hz. When the positively charged particles come near stacked bar array 1503, they are attracted to the oppositely polarized electric field and move quickly towards it. As each successive electrode changes polarity, the positively charged particles are repelled from that electrode and attracted to the next electrode in the series. The resulting forward velocity of charged microspheres 1501 causes those microspheres to traverse the length of stacked bar array 1503 and thence in an arc 1506 down discharge chute 1507 for collection. Discharge chute 1507 may comprise, for example, a 2-inch 304 stainless steel schedule 10 pipe with 2-inch NPT threads on both ends.

FIG. 16 is a schematic representation of one embodiment of an apparatus for the stacked bar array used to create an electronically stabilized portion of an electrostatic "traveling wave" electric field. The stacked array is comprised of equally-spaced electric field electrode plates 1601 disposed between electric insulation spacers 1602 to provide an assembly of alternating electric field electrode plates 1601 (three are shown in FIG. 16, but many more are preferably used in practice) and electrical insulators 1602 joined by epoxy 1607. Insulation spacers 1602 may comprise, for example, ⅛-inch by 6-inch by 6-inch pieces of Teflon®. Electrodes disposed within electric field electrode plates 1601 (see FIG. 16A) are electrically connected through connection points 1603 to a power source (not shown), which is preferably a high-voltage, multi-phase DC power source. Connection points 1603 may comprise, for example, 10–32 screw attachment points on each of the four electrodes within the electric field electrode plate 1601 in the stacked array (see FIG. 16A). The electrode connection points are connected to the power source (lines 1604, 1605, 1606 in FIG. 16), and the lines are energized by the power source in sequence along the length of the array to provide the traveling wave electric field. The power source (not shown) may comprise, for example, a bank of high-voltage transformers with the primary input sequentially triggered by relays, such as Opto® electronic relays. The stacked bar array is preferably potted in non-conductive epoxy resin 1608 to provide electrical insulation from the microspheres and to prevent shorting of electric field electrode plates 1601 during operation.

The electronically stabilized portion of the electrostatic "traveling wave" electric field makes use of the charged microspheres' electrical polarization to provide an electronic "tunnel" (1613) for the microspheres by placing negative electrodes 1609 and 1610 and positive electrodes 1611 and 1612, as shown in FIG. 16A, to create two electric fields that provide their weakest common point in the center of electric field electrode plates 1601. Electrode plates 1601 may comprise, for example, 1-inch by 6-inch by 6-inch pieces of Teflon® drilled through with four ¼-inch holes for electrodes 1609, 1610, 1611, and 1612, and a large centered hole 1613 for the charged microspheres 1614 to travel through. Electrodes 1609, 1610, 1611, and 1612 are preferably ¼-inch by 1-inch aluminum and are each drilled and tapped with a 10–32 screw hole for electrical wire attachment 1603. Positive terminals 1611 and 1612 are electrically connected together and wired to the positive portion of the power source, while negative terminals 1609 and 1610 are electrically connected together and wired to ground.

Although FIG. 13 represents one embodiment of an apparatus for creating essentially spherical microballs, or microspheres, according to the present invention, other configurations may be employed (for example, the liquid droplets may be cooled through a chute or ramp). Although an electrostatic collecting mechanism is typically employed to reduce deformation and/or surface marring of the microspheres, other types of collecting or catching apparatus may be employed at or near the point of minimum vertical velocity 214 in FIG. 12. For example, a conveyer apparatus having a soft surface or a liquid collection bath may also be employed; also, the droplets may be collected by air levitation or acoustically. After capture, microspheres are typically conveyed to a collection container or bucket.

Embodiments of the present invention employing an electrostatic charging and collection system may be successfully practiced to create microspheres from droplet streams comprised of, without limitation, metals such as copper, tin, lead, nickel, gold, silver, and aluminum; metal alloys such as solder and steel; and other materials such as glass, polymers, drugs, dielectrics, adhesives, and radioactive materials.

The following example is illustrative and should not be construed as limiting the scope of the invention or claims thereof.

EXAMPLE 1

Using the apparatus of FIG. 13, molten solder (63/37) was jetted at 425° F. and at 35 psi in a controlled nitrogen environment. The solder was jetted through a 0.016-inch diameter orifice and 0.028-inch diameter microspheres were produced having uniform sphericity.

Although solder containing 63% tin and 37% lead was used in Example 1, any metals or other materials capable of liquefying within the temperature limits of the jetting equipment (in the case of the test equipment of FIG. 13, about 2100° F.). Using the apparatus of FIG. 13, it has been found that the size of the balls formed may be as small as about 0.5 microns and may be as large as the catcher mechanical limits will allow. Ball uniformity should be within about 0.5% volume.

Applications

Liquid droplet generators according to the present invention permit an ink-jet type deposition technique wherein drops of uniform size and controlled spacing may be precisely placed. This has advantages in a variety of applications.

1) Soldering techniques: Using apparatus and methods according to the present invention permits solder to be printed after the printed circuit board has been fabricated. This provides a flexibility in fabrication processes and sequencing that is not possible by currently known methods. Although board flatness is critical in screen printing of solder paste, liquid-metal droplet systems according to the present invention are less sensitive to flatness. A controlled quantity of solder allows an optimal amount of solder to be dispensed for each component with accuracy and predictability. In addition, different thicknesses of solder on the same circuit board may be deposited. By varying parameters such as the diameter of the orifice, metal droplets of varying sizes may be obtained in a controlled and predictable manner. An optimum solder amount may then be placed according to the physical demands of different-sized components.

The uniformity of droplets formed by the apparatus and method of the present invention renders feasible deposition of solder on device pads for special packaging. Several new bonding processes require creation of a solder ball directly on the device pad. Examples include Flip Chip Bonding, ball grid arrays, bumps for Tape Automated Bonding (TAB), solder pads for flex circuit interconnects, etc. Flip Chip Bonding requires the creation of a solder ball directly on the integrated circuit (IC) bonding pad by solder plating followed by reflow to let surface tension create the spherical ball. Because the liquid-metal droplet systems according to the present invention dispense metal droplets of predictable and uniform size, flip chips may be bonded by dispensing solder droplets directly onto the device bond pads or onto the circuit board surface.

2) Direct deposition of circuit patterns and devices: The accuracy and predictability of the device and method of the present invention will permit circuit paths to be drawn remotely using direct deposition of silver, copper, gold or other suitable alloys or conductive epoxies onto circuit boards. Suitable intermediate material or some other inclusion may be desired to improve adhesion or to modify material properties (such as dielectric constant or conductivity, etc.) in a predetermined manner. Passive devices such as resistors, inductors, capacitors and diodes may be directly deposited onto a circuit board using the apparatus and methods of the present invention with suitable combinations of materials. In addition, active devices such as transistors may be fabricated directly on the circuit board using the apparatus and methods of the present invention. Rapid prototyping and just-in-time manufacturing is thus feasible.

3) Production of balls: Balls of various materials and of predictable and uniform dimensions may be produced for various applications, including: micro ball bearings; solder balls for ball grid arrays; metal balls for use in thick film or solder paste; semiconductor balls for fabrication of thermoelectric devices elements; semiconductor balls for fabrication of photovoltaic devices; glass balls for fiber optics; dielectric spheres for heat sensitive epoxy; and balls of high temperature material for use as feedstock in further manufacturing process (e.g., enriched uranium or plutonium for fabrication of nuclear fuel).

4) Manufacture and repair: With the capability for emitting droplets of high-temperature liquids, the apparatus and devices of the present invention may be used in various manufacturing and repair applications, such as microwelding, brazing, and sealing of joints using molten metals. The accuracy, predictability, and fine droplet stream possible according to the present invention are particularly suited for use in jewelry manufacture and repair.

5) Interconnection techniques: New and unique methods of interconnection for multichips modules (MCM) and chip-on-board (COB) or semiconductor devices may be developed using the devices and methods of droplet generation according to the present invention. In addition, dispensing of glass droplets could be used for fiber optic interconnects and to product the fibers themselves.

6) Marking and pattern generation: The accuracy and predictability of droplet generation according to the present invention can be exploited in a manner similar to ink-jet printing. This will permit "printing" or marking of product names, serial information, bar codes, etc. by selectively deflecting droplets from jet streams of high-temperature liquids such as metals or polymers.

Similarly, patterns of high-temperature liquids (such as polymers and epoxies) may be applied for electronic interconnections and adhesion purposes.

7) Microwave circuit component fabrication: The liquid metal deposition technique according to the present invention permits the creation of structures with a large height-to-width aspect ratio. This property may be used to design unique microwave components by exploiting the space along the normal to the substrate surface for design and fabrication. Devices include filters, couplers, and slow-wave structures. Typical deposition materials include solder alloys, gold, nickel and copper.

8) Fabrication of micromechanical parts: Micromechanical parts or other suitable three-dimensional structures, such as gears and levers, may be constructed using the precision placement and the stacking of droplets formed according to the present invention. Due to the inherent solidification process, parts produced according to this technique are of superior material strength.

9) Masks and pretin: The liquid metal jet system according to the present invention may also be used to dispense patterns of liquid metal on a copper clad panel as a mask. For example, solder may be dispensed as a mask and pretin for the manufacturing of circuit boards. Extraneous copper may then be etched away, leaving the circuit board artwork intact and already pretinned. This process may replace photolithography (eliminating hazardous wastes and high costs associated therewith) by laying patterns down directly, thereby greatly increasing manufacturing flexibility.

10) Circuit board repair: Repair of surface-mount electronic circuit boards may be realized by removing defective components and old solder according to conventional methods. Subsequently, accurate amounts of solder may be dispensed according to the present invention in a precise pattern to allow a more reliable repair when the component is reflowed. For example, this will result in reduced likelihood of excess solder being inadvertently placed at a particular joint to bridge between conductors or to "lift" the component off the conductor pads.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having the benefit of this description of the invention.

What is claimed is:

1. Apparatus for creating and collecting solid microspheres, comprising:
    a liquid droplet generator disposed to emit droplets in a generally upward direction to cause emitted droplets to travel a parabolic path;
    cooling means in said parabolic path to solidify said droplets into solid microspheres, wherein said cooling means allows said droplets and solid microspheres to pass without physical deformation; and
    a microsphere transport system disposed to receive said solid microspheres at about the top of said parabolic path and configured to transport said solid microspheres to a collection point.

2. The apparatus of claim 1, further comprising a jet control system for imparting an electrical charge on droplets emitted from said liquid droplet generator, wherein said microsphere transport system is configured to transport charged microspheres electrostatically with a traveling wave electric field.

3. The apparatus of claim 2, wherein said jet control system comprises:
    a positive electrode plate;
    a negative electrode plate disposed parallel to said positive electrode plate, wherein said positive and negative electrode plates form a gap for receiving liquid droplets from said liquid droplet generator; and
    a DC voltage source coupled to said positive and negative electrode plates.

4. The apparatus of claim 2, wherein said microsphere transport system comprises:
    a stacked array comprising a plurality of electric field electrode plates disposed in an alternating arrangement between electric insulation spacers;
    a plurality of positive and a plurality of negative electrodes disposed within each said field electrode plate in said stacked array; and
    a power source electrically coupled to said positive electrodes to provide power to each said field electrode plate in sequence along the length of the array;
    wherein each said field electrode plate has a centrally-located hole to form a tunnel internal to said stacked array for admitting charged microspheres.

5. The apparatus of claim 1, wherein said liquid droplet generator is disposed to emit droplets vertically.

6. The apparatus of claim 1, wherein said microsphere transport system comprises a liquid stream.

7. The apparatus of claim 1, wherein said microsphere transport system comprises a conveyor.

8. The apparatus of claim 1, wherein said microsphere transport system comprises an gas levitator.

9. The apparatus of claim 1, wherein said liquid droplet generator comprises:

a delivery tube having a wall;

an electromechanical driver element disposed to transmit pressure pulses to said wall; and a power supply coupled to said electromechanical driver.

10. The apparatus of claim 1, wherein said cooling means comprises air at room temperature.

11. The apparatus of claim 1, wherein said cooling means comprises a gas substantially colder than air at room temperature.

12. Apparatus for creating and collecting solid microspheres, comprising:

a liquid droplet generator disposed to emit liquid droplets in a generally upward direction to cause said droplets to travel a generally parabolic path;

a jet control system for imparting an electrical charge on droplets emitted from said liquid droplet generator;

a sealed environmental chamber coupled to said liquid droplet generator for solidifying emitted, charged liquid droplets into solid, charged microspheres;

cooling means coupled to said sealed environmental chamber for cooling the atmosphere inside said sealed environmental chamber;

a discharge chute coupled to said environmental chamber; and an electrostatic microsphere transport system disposed to receive solid, charged microspheres at about the top of said parabolic path and configured to transport said microspheres via a traveling wave electric field to said discharge chute.

13. The apparatus of claim 12, wherein said liquid droplet generator comprises:

a delivery tube having a wall;

an electromechanical driver element disposed to transmit pressure pulses to said wall; and a power supply coupled to said electromechanical driver.

14. The apparatus of claim 12, wherein said cooling means comprises:

a dispersing nozzle coupled to said sealed environmental chamber; and a gas source coupled to said dispersing nozzle for delivering a cooling gas through said dispersing nozzle into said sealed environmental chamber.

15. The apparatus of claim 12, wherein said jet control system comprises:

a positive electrode plate;

a negative electrode plate disposed parallel to said positive electrode plate, wherein said positive and negative electrode plates form a gap for receiving liquid droplets from said liquid droplet generator; and a DC voltage source coupled to said positive and negative electrode plates.

16. The apparatus of claim 12, wherein said microsphere transport system comprises:

a stacked array comprising a plurality of electric field electrode plates disposed in an alternating arrangement between electric insulation spacers;

a plurality of positive and a plurality of negative electrodes disposed within each said field electrode plate in said stacked array; and a power source electrically coupled to said positive electrodes to provide power to each said field electrode plate in sequence along the length of the array;

wherein each said field electrode plate has a centrally-located hole to form a tunnel internal to said stacked array for admitting charged microspheres.

17. Apparatus for creating and collecting solid microspheres, comprising:

a sealed environmental chamber;

a liquid droplet generator disposed to emit liquid droplets in a generally horizontal direction into said environmental chamber, defining a pathway;

cooling means coupled to said sealed environmental chamber for cooling said droplets to form solid microspheres;

a discharge chute coupled to said environmental chamber; and a microsphere transport system placed in said pathway for receiving said solid microspheres at a point of minimum velocity and transporting said solid microspheres to said discharge chute.

18. The apparatus of claim 17, wherein said liquid droplet generator comprises:

a delivery tube having a wall;

an electromechanical driver element disposed to transmit pressure pulses to said wall; and a power supply coupled to said electromechanical driver.

19. The apparatus of claim 17, wherein said cooling means comprises:

a dispersing nozzle coupled to said sealed environmental chamber; and a gas source coupled to said dispersing nozzle for delivering a cooling gas through said dispersing nozzle into said sealed environmental chamber.

20. The apparatus of claim 17, wherein said microsphere transport system comprises a gas levitator.

21. The apparatus of claim 17, wherein said microsphere transport system comprises a conveyor.

22. The apparatus of claim 17, further comprising a jet control system for imparting an electrical charge on droplets emitted from said liquid droplet generator, comprising:

a positive electrode plate;

a negative electrode plate disposed parallel to said positive electrode plate, wherein said positive and negative electrode plates form a gap for receiving liquid droplets from said liquid droplet generator; and a DC voltage source coupled to said positive and negative electrode plates.

23. The apparatus of claim 22, wherein said microsphere transport system comprises:

a stacked array comprising a plurality of electric field electrode plates disposed in an alternating arrangement between electric insulation spacers;

a plurality of positive and a plurality of negative electrodes disposed within each said field electrode plate in said stacked array; and a power source electrically coupled to said positive electrodes to provide power to each said field electrode plate in sequence along the length of the array;

wherein each said field electrode plate has a centrally-located hole to form a tunnel internal to said stacked array for admitting solid microspheres.

24. The apparatus of claim 17, wherein said microsphere transport system comprises a liquid stream.

25. The apparatus of claim 24, wherein said cooling means comprises:
   a dispersing nozzle coupled to said sealed environmental chamber; and
   a gas source coupled to said dispersing nozzle for delivering a cooling gas through said dispersing nozzle into said sealed environmental chamber.

26. Apparatus for creating and collecting solid microspheres, comprising:
   a sealed environmental chamber;
   a liquid droplet generator disposed to emit liquid droplets generally upwardly into said environmental chamber to cause said droplets to travel a generally parabolic path;
   cooling means coupled to said sealed environmental chamber for cooling said droplets to form solid microspheres;
   a discharge chute coupled to said environmental chamber; and
   a microsphere transport system placed proximal to the top of said parabolic path for receiving said solid microspheres at about said top of said parabolic path and transporting said solid microspheres to said discharge chute.

27. The apparatus of claim 26, wherein said liquid droplet generator comprises:
   a delivery tube having a wall;
   an electromechanical driver element disposed to transmit pressure pulses to said wall; and
   a power supply coupled to said electromechanical driver.

28. The apparatus of claim 26, wherein said microsphere transport system comprises an air levitator.

29. The apparatus of claim 28, wherein said microsphere transport system comprises:
   a stacked array comprising a plurality of electric field electrode plates disposed in an alternating arrangement between electric insulation spacers;
   a plurality of positive and a plurality of negative electrodes disposed within each said field electrode plate in said stacked array; and
   a power source electrically coupled to said positive electrodes to provide power to each said field electrode plate in sequence along the length of the array;
   wherein each said field electrode plate has a centrally-located hole to form a tunnel internal to said stacked array for admitting solid microspheres.

30. The apparatus of claim 26, wherein said microsphere transport system comprises a conveyor.

31. The apparatus of claim 26, further comprising a jet control system for imparting an electrical charge on droplets emitted from said liquid droplet generator, comprising:
   a positive electrode plate;
   a negative electrode plate disposed parallel to said positive electrode plate, wherein said positive and negative electrode plates form a gap for receiving liquid droplets from said liquid droplet generator; and
   a DC voltage source coupled to said positive and negative electrode plates.

32. The apparatus of claim 26, wherein said microsphere transport system comprises a liquid stream.

* * * * *

UNITED STATES PATENT AND TRADEMARK OFFICE
CERTIFICATE OF CORRECTION

PATENT NO. : 5,810,988

DATED : September 22, 1998

INVENTOR(S) : Smith et al.

It is certified that error appears in the above-identified patent and that said Letters Patent is hereby corrected as shown below:

Title page, item [54], and in column 1, line 1, delete "AND METHOD"

Signed and Sealed this

Fifteenth Day of December, 1998

*Attest:*

*Attesting Officer*

BRUCE LEHMAN

*Commissioner of Patents and Trademarks*